(12) United States Patent
Hsu et al.

(10) Patent No.: US 10,410,893 B2
(45) Date of Patent: Sep. 10, 2019

(54) MICRO ELEMENTS TRANSFER DEVICE AND METHOD

(71) Applicant: XIAMEN SANAN OPTOELECTRONICS TECHNOLOGY CO., LTD., Xiamen (CN)

(72) Inventors: Chen-ke Hsu, Xiamen (CN); Jiali Zhuo, Xiamen (CN); Xiaojuan Shao, Xiamen (CN); Jiansen Zheng, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/871,982

(22) Filed: Jan. 16, 2018

(65) Prior Publication Data

US 2018/0158706 A1  Jun. 7, 2018

Related U.S. Application Data

(63) Continuation of application No. PCT/CN2016/104869, filed on Nov. 7, 2016.

(30) Foreign Application Priority Data

Nov. 4, 2016 (CN) .......................... 2016 1 0961364

(51) Int. Cl.
*G11C 5/02* (2006.01)
*H01L 21/67* (2006.01)
(Continued)

(52) U.S. Cl.
CPC .... *H01L 21/67288* (2013.01); *G01R 31/2887* (2013.01); *H01L 22/34* (2013.01);
(Continued)

(58) Field of Classification Search
CPC ... H01L 21/67288; H01L 22/34; H01L 24/00; H01L 21/6838; H01L 22/14; G01R 31/2887
(Continued)

(56) References Cited

U.S. PATENT DOCUMENTS 8,507,357 B2 * 8/2013 Lin ..................... H01L 21/0242
257/44
9,219,194 B2 * 12/2015 Shi ........................ H01L 33/145
(Continued)

FOREIGN PATENT DOCUMENTS

| CN | 1755935 A | 4/2006 |
| CN | 101499425 A | 8/2009 |
| CN | 105263854 A | 1/2016 |

*Primary Examiner* — Viet Q Nguyen
(74) *Attorney, Agent, or Firm* — Syncoda LLC; Feng Ma

(57) ABSTRACT

A transfer device for micro element with a test circuit can test the micro element during transfer. The transfer device for micro elements includes: a base substrate, having two surfaces opposite to each other; a pick-up head array, formed over the first surface of the base substrate for picking up or releasing the micro element; a test circuit set inside or/on the surface of the base substrate, which has a series of sub-test circuits, each sub-test circuit at least having two test electrodes for simultaneous test of photoelectric parameters of the micro element when the transfer device transfers the micro element.

20 Claims, 37 Drawing Sheets

(51) Int. Cl.
*H01L 21/66* (2006.01)
*H01L 23/00* (2006.01)
*G01R 31/28* (2006.01)
*H01L 21/683* (2006.01)

(52) U.S. Cl.
CPC .......... *H01L 24/00* (2013.01); *H01L 21/6838* (2013.01); *H01L 22/14* (2013.01)

(58) Field of Classification Search
USPC ........................................................ 257/424
See application file for complete search history.

(56) References Cited

U.S. PATENT DOCUMENTS

| | | | |
|---|---|---|---|
| 9,437,793 B2* | 9/2016 | Shi | H01L 33/62 |
| 9,966,514 B2* | 5/2018 | Hsu | H01L 33/60 |
| 10,014,460 B2* | 7/2018 | Zhong | H01L 33/62 |
| 10,163,869 B2* | 12/2018 | Zou | H01L 33/0079 |
| 10,181,546 B2* | 1/2019 | Zou | H01L 21/68 |
| 2013/0009044 A1* | 1/2013 | Inomata | H01L 22/32 |
| | | | 250/208.1 |
| 2017/0142874 A1* | 5/2017 | Pourchet | H01L 21/6836 |
| 2018/0351030 A1* | 12/2018 | Goward | H01L 33/00 |

* cited by examiner

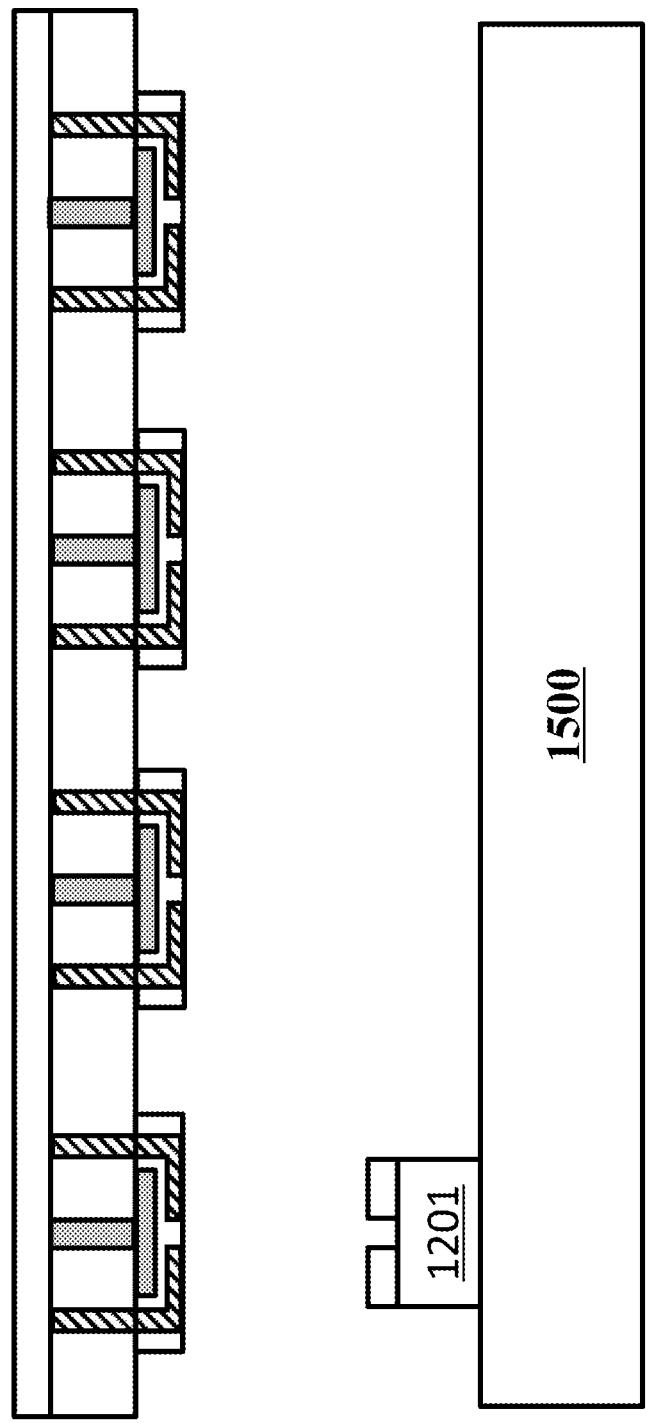

MICRO ELEMENTS TRANSFER DEVICE AND METHOD

CROSS-REFERENCE TO RELATED APPLICATIONS

The present application is a continuation of, and claims priority to, PCT/CN2016/104869 filed on Nov. 7, 2016, which claims priority to Chinese Patent Application No. 201610961364.5 filed on Nov. 4, 2016. The disclosures of these applications are hereby incorporated by reference in their entirety.

BACKGROUND

Micro element technologies refer to integrate micro-size element arrays in high density over the substrate. At present, the micro light emitting diode (Micro LED) technique is becoming a hot research topic, and the industry circle expects high-quality micro element products in the market. High-quality micro light emitting diode products have profound impacts on conventional display products in the market, such as LCD/OLED.

During fabrication of the micro element, at first, a micro element is formed over the donor substrate, and then the micro element is transferred to the acceptor substrate. For example, the acceptor substrate is a display screen.

SUMMARY

The inventors of the present disclosure have recognized that, one difficulty during micro element fabrication is: how to transfer the micro element from the donor substrate to the acceptor substrate.

In conventional micro element transfer, the micro element is transferred to the acceptor substrate through a transfer substrate via wafer bonding. Direct transfer is a kind of method by directly bonding the micro element array to the acceptor substrate from the transfer substrate, and then removing the transfer substrate. Indirect transfer is the other method. This method includes two times of bonding/lifting-off steps. At first, the transfer substrate extracts the micro element array from the donor substrate, and bonds the micro element array to the acceptor substrate. Finally, remove the transfer substrate. The micro element array is generally extracted by electrostatic method. During electrostatic extraction, a transfer head array is required.

Embodiments of the present disclosure provide a transfer device of micro element with a test circuit, to test micro elements and remove unqualified micro elements during transfer.

In an aspect: a transfer device of micro element is provided, including: a base substrate, having two surfaces opposite to each other; a pick-up head array, formed over the first surface of the base substrate for picking up or releasing the micro element; a test circuit set inside or/on the surface of the base substrate, which has a series of sub-test circuits, each sub-test circuit at least having two test electrodes for simultaneous test of photoelectric parameters of the micro element when the transfer device transfers the micro element.

In some embodiments, at least one test electrode of each sub-test circuit is formed over the surface of the pick-up head for contacting with the micro element, and for connecting the micro element electrode when the pick-up head array contacts with the micro element.

In some embodiments, the test circuit also comprises a retractable electrode located on the first surface of the base substrate, which forms a sub-test circuit together with the test electrode formed over the surface of the pick-up head for contacting with the micro element, which can be applied in micro elements with electrodes at different sides, such as a vertical micro light emitting diode.

In some embodiments, the transfer device also comprises a CMOS integrated circuit over the second surface of the base substrate, which connects to the test circuit.

In some embodiments, the base substrate has a through-hole structure, wherein, the test circuit passes through the through-hole structure and extends to the second surface of the base substrate.

In some embodiments, the base substrate is a Si substrate, and the CMOS integrated circuit is formed by a portion of the Si substrate.

In some embodiments, the CMOS integrated circuit is a structure layer formed over the base substrate.

In some embodiments, the pick-up head array picks up the micro element through electrostatic force, Van der Waals force and vacuum adsorption force.

In some embodiments, the pick-up head has a static electrode layer and a dielectric layer on the electrode layer, wherein, when the electrode layer applies absorption voltage, the pick-up head produces static attraction force to pick up the micro element contact therewith.

In some embodiments, the surface of each pick-up head of the pick-up head array is made of biomimetic gecko material to absorb the micro element by virtue of absorption capacity of the biomimetic gecko material.

In some embodiments, the pick-up head array is a series of suction nozzle arrays, which absorb or release the micro element through vacuum pressure. In an embodiment, the transfer device also comprises a cavity, a plurality of vacuum paths and a switch component, wherein, the suction nozzle array is connected to the cavity via a plurality of vacuum paths, and valves are set at the connection place for switching on/off. The switch component is used for controlling on or off of the valve of each vacuum path so that the suction nozzle is controlled to absorb or release required micro element through vacuum pressure.

In some embodiments, the switch component comprises a CMOS integrated circuit and an address electrode array connected to the CMOS integrated circuit, wherein, each vacuum path valve corresponds to the address electrode array.

In some embodiments, the valve is a movable member, wherein, the address electrode array is under selective excitation by the CMOS integrated circuit with voltage potential to generate electrostatic attraction, through which, corresponding movable member would deflect or approach to corresponding address electrode, thus controlling opening or closing of each vacuum path.

In some embodiments, the vacuum path is a series of micro-hole structures passing through the base substrate, wherein, one end is connected to the cavity, and the other is connected to the suction nozzle.

In some embodiments, the pick-up head size is below 100 μm, and the space is below 200 μm.

Various embodiments of the present disclosure also provide a transfer method for prior removal of micro element defects, comprising: providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; positioning the transfer device on the micro element connected to the carrier substrate so that the test electrode contacts with the micro element; applying test voltage on the test circuit to form a test hoop for testing the micro element and obtaining defect pattern of the micro element of the carrier substrate.

In some embodiments, a transfer method for prior removal of micro element defects is disclosed, comprising: (1) providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; (2) positioning the transfer device on the micro element connected to the carrier substrate; (3) contacting the test electrode with the micro element electrode, and applying test voltage on the test circuit to form a test hoop for testing the micro element and obtaining defect pattern of the micro element of the carrier substrate; (4) picking up qualified micro elements over the carrier substrate with the pick-up head array of the transfer device; and (5) releasing required micro elements on the acceptor substrate.

In some embodiments, a transfer method for prior removal of micro element defects is disclosed, comprising: (1) providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; (2) positioning the transfer device on the micro element connected to the carrier substrate; (3) contacting the test electrode with the micro element electrode, and applying test voltage on the test circuit to form a test hoop for testing the micro element and obtaining defect pattern of the micro element of the carrier substrate; (4) picking up unqualified micro elements over the carrier substrate with the pick-up head array of the transfer device; and (5) releasing unqualified micro elements on the acceptor substrate.

In some embodiments, a transfer method for prior removal of micro element defects is disclosed, comprising: (1) providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; (2) positioning the transfer device on the micro element connected to the carrier substrate; (3) contacting the test electrode with the micro element electrode, and applying test voltage on the test circuit to form a test hoop for testing the micro element and obtaining defect pattern of the micro element of the carrier substrate; (4) picking up micro elements over the carrier substrate with the pick-up head array of the transfer device; and (5) releasing unqualified and qualified micro elements onto different acceptor substrates respectively.

In some embodiments, a transfer method for prior removal of micro element defects is disclosed, comprising: (1) providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; (2) positioning the transfer device on the micro element connected to the carrier substrate; (3) picking up the micro elements of the carrier substrate with the pick-up head array of the transfer device; (4) releasing the micro elements on the first acceptor substrate; (5) contacting the test electrode of the transfer device with the micro element electrode, and applying test voltage on the test circuit to form a test hoop for testing the micro element and obtaining defect pattern of the micro element of the first acceptor substrate; (6) picking up unqualified micro elements on the first acceptor substrate with the pick-up head array of the transfer device; and (7) releasing unqualified micro elements on the second acceptor substrate.

In some embodiments, the pick-up head array can pick up the micro element through electrostatic force, Van der Waals force and vacuum adsorption force.

According to another embodiment of the present invention, a method for fabricating a micro element device is provided, comprising the transfer of the micro element to the receiving substrate of the micro element device through the method disclosed in the present invention.

According to another embodiment of the present invention, a micro element device fabricated according to the method disclosed in the present invention is provided.

According to another embodiment of the present invention, an electronic device comprising the micro element device of the present invention is provided.

In some embodiments, the method above can further include: (4) using the pick-up array of the transfer device to pick up micro elements on the carrier substrate; (5) releasing unqualified and qualified micro elements on different acceptor substrates.

In another aspect, a transfer method of micro element is provided, the method including: (1) providing a transfer device, which comprises a base substrate, a pick-up head array formed over the surface of the base substrate and a test circuit inside or/and on the surface of the base substrate, wherein, the test circuit has a series of sub-test circuits, each sub-test circuit having at least two test electrodes; (2) positioning the transfer device on the micro element connected to the carrier substrate; (3) using the pick-up array of the transfer device to pick up micro elements on the carrier substrate; (4) releasing micro elements on the first acceptor substrate; (5) contacting the test electrode of the transfer device with the micro element electrode to apply test voltage on the test circuit to form a test loop for testing the micro element and obtaining defect pattern of the micro element of the first acceptor substrate; (6) using the pick-up array of the transfer device to pick up unqualified micro elements on the first acceptor substrate; (7) releasing unqualified micro elements on the second acceptor substrate.

In another aspect, a method for fabricating a micro element device, is provided, including any of micro element transfer method with prior removal of defects as described above.

In another aspect, a micro element device fabricated according to the method above is provided.

In another aspect, an electronic device including the micro element device described above is provided.

The other features and advantages of this present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

In addition, it should be understood by those skilled in the art that despite many problems in the prior art, the technical scheme of each embodiment or claim of the present invention can be improved in one or several aspects. It is not necessary to solve all technical problems listed in the prior art or the background art. It should be understood by those skilled in the art that contents not mentioned in a claim shall not be construed as limiting the claim.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

FIG. 18 is a cross-sectional view of FIG. 14 along line B-B, in which the vacuum path is ON.

FIG. 37 illustrates a fifth step of the transfer method of the micro element according to the ninth embodiment.

Figure 1:
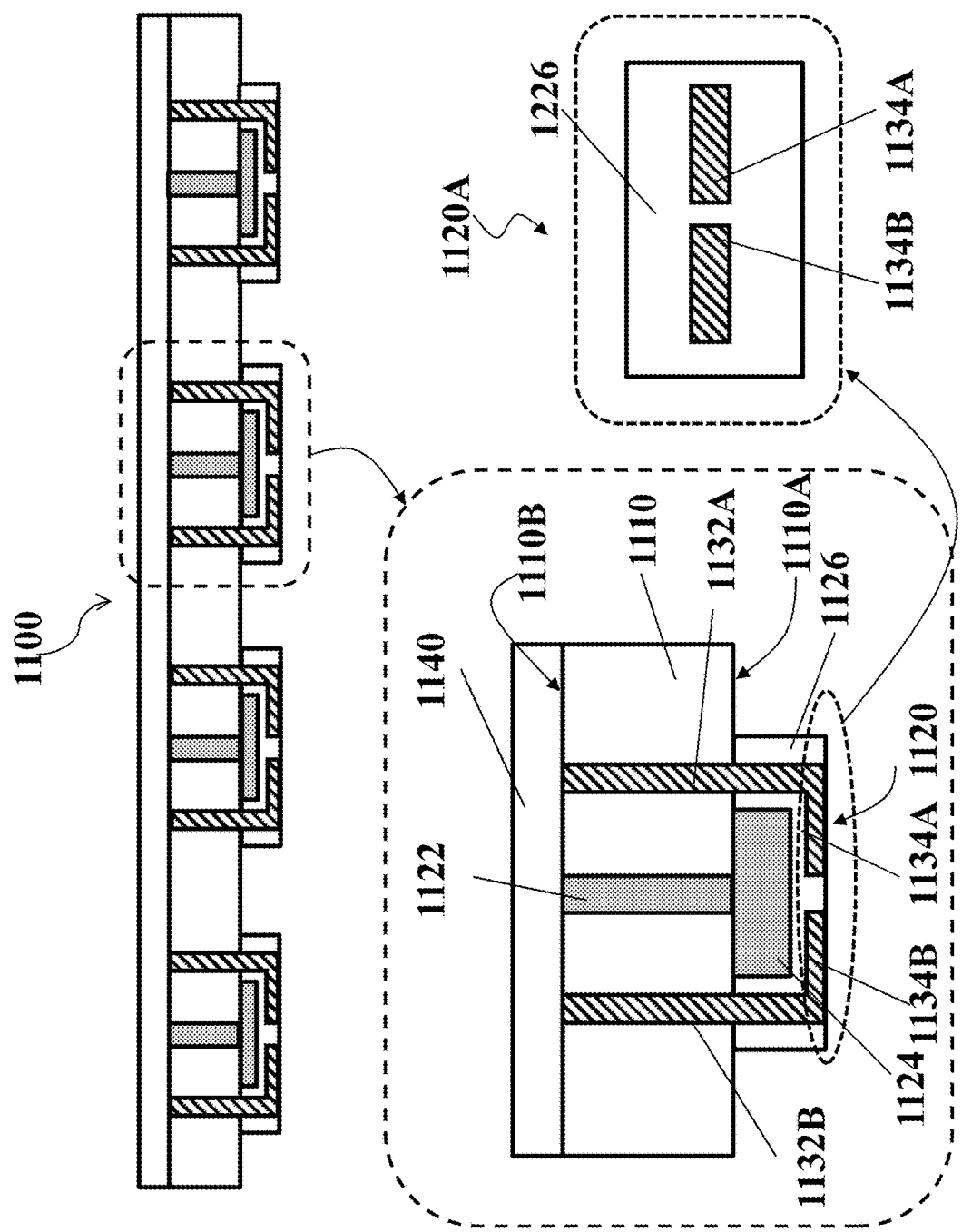
FIG. 1 is a side sectional view of a transfer device of micro element according to a first embodiment of the present disclosure.

In the drawings: 1100, 2100, 3100, 4100, 5100: transfer device; 1110, 2110, 3110, 4110, 5110: base substrate; 1110A: first surface of the base substrate; 1110B: second surface of the base substrate; 1120, 2120, 3120, 4120, 5120: pick-up head; 1120A: surface of the pick-up head for contacting with the micro element; 1122, 2122, 3122: electrostatic circuit connecting line of the pick-up head; 1124, 2124, 3124: electrode layer of the pick-up head; 1126, 2126, 3126: dielectric layer; 1132A, 1132B, 2132A, 2132B, 3132, 4132A, 4132B, 5132A, 5132B: circuit; 1134A, 1134B, 2134A, 2134B, 3134, 4134A, 4134B, 5134A, 5134B: test electrode; 2136, 3136: retractable electrode; 1140, 2140, 3140, 4140: CMOS integrated circuit; 1200, 2200, 3200: micro element; 1220A, 1220B, 3220: micro element electrode; 1300, 2300, 3300: carrier substrate; 1310, 2310, 3310: middle layer; 1140, 2140, 3140, 4140: CMOS integrated circuit; 5138: insulating protective layer; 5150: through hole/vacuum path; 5152: valve/movable member; 5154: carrier layer; 5160: cavity; 5170: CMOS integrated circuit; 5172: address electrode layer; 5174: address electrode.

DETAILED DESCRIPTION

This embodiment describes a micro element transfer device and method for transferring a micro element with the transfer device. The micro element array can be a micro LED device, a diode, a transistor, an integrated chip (IC), with size of 1-100 μm, which is not limited to this size. In addition, some aspects of the embodiment may apply to larger or smaller sizes. The embodiments below describe a micro element transfer device and method for transferring a micro element with the transfer device. The transfer device has a pick-up head array for picking up or releasing the micro element, and size (such as length or width) of each pick-up head is 1-100 µm. The transfer device also has a test circuit, and each pick-up head corresponds to a sub-test circuit. When the pick-up head contacts with the micro element, voltage is applied on the test circuit to form a test hoop for photoelectric performance test of the micro element. Therefore, defect pattern of the defect micro element is obtained to remove defect micro elements during micro element array transfer.

FIG. 1 is a side section view of a transfer device according to the first preferred embodiment of the present invention. The transfer device 1100 comprises: a base substrate 1110, an array of pick-up head 1120, a test circuit and a CMOS integrated circuit 1140. Specifically, the base substrate 1110 is for supporting, which can be made of a variety of materials, such as Si, ceramics and polymer. The pick-up head 1120 is formed over the first surface 1110A of the base substrate 1110 in an array arrangement. The size range is 1 µm-100 µm, and the size, for example, can be 50 µm-20 µm. The pitch is (1 µm-100 µm)×(1 µm-100 µm), such as 10 µm×10 µm or 50 µm×100 µm. The array of pick-up head 1120 is located on the first surface 1110A of the base substrate 1100 for picking up the micro element through various adsorption forces (such as electrostatic force, vacuum pressure, Van der Waals force, magnetic force and the like) for print transfer. In some embodiments, each pick-up head can be independently controllable for selective pick-up and release of the micro element. The test circuit is composed of a series of sub-test circuits, each sub-test circuit corresponding to a pick-up head 1120, and having at least two test electrodes 1134A and 1134B, wherein, the sub-test circuit is connected to the working electronic device of the test module such as CMOS integrated circuit 1140 via the circuits 1132A and 1132B.

Figure 2:
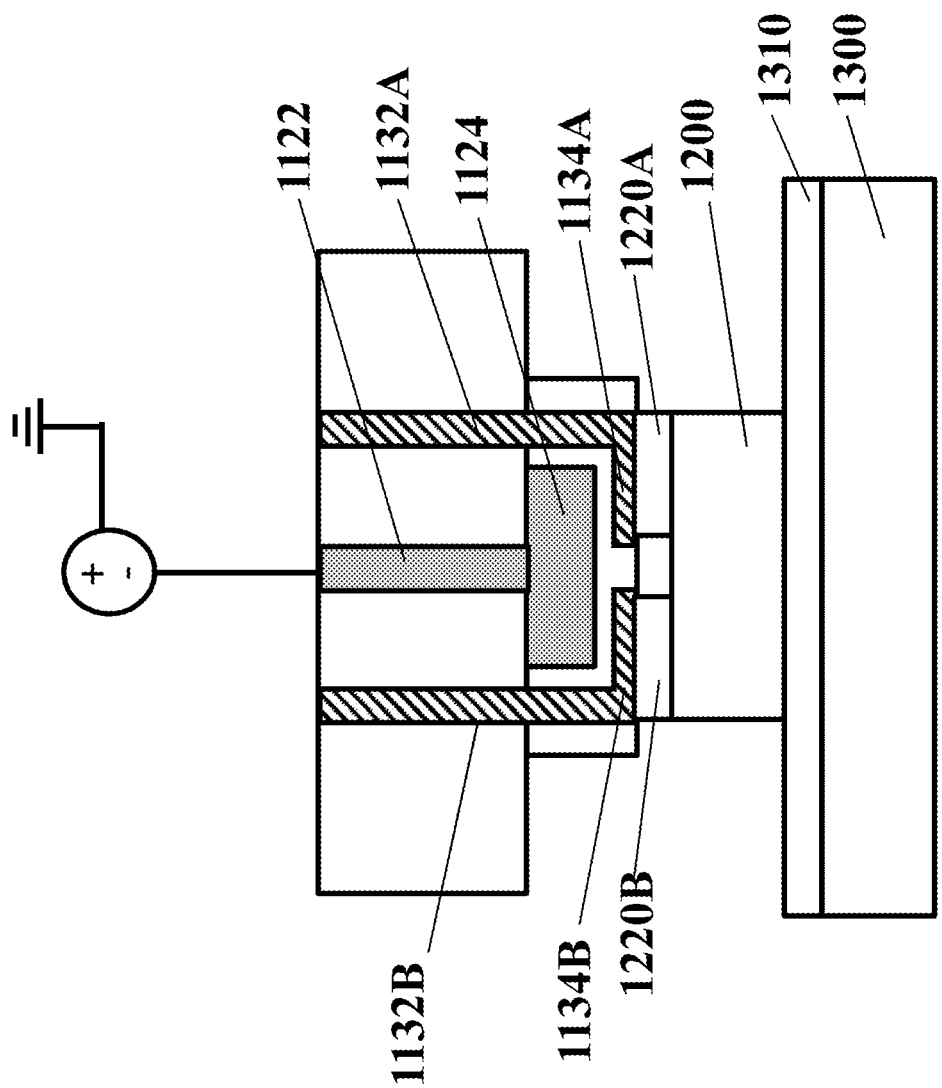
FIG. 2 is a schematic diagram showing that voltage is applied on the electrode layer of the pick-up head of the transfer device as shown in FIG. 1 to produce statistic absorption force.

In this embodiment, the array of pick-up head 1120 picks up and releases the micro element through electrostatic force, wherein, each pick-up head 1120 corresponds to an electrostatic adsorption circuit, comprising a connection circuit 1122 and an electrode layer 1124, wherein, the connection line 1122 can go through the base substrate 1110, and connect to the CMOS integrated circuit 1140 so as to connect to external electronic control piece. The surface of the electrode layer 1124 is covered with a dielectric layer 1126. Thus, when absorption voltage is applied on the electrode layer 1124, electrostatic adsorption force is formed to pick up the micro element, as shown in FIG. 2.

The test circuit of the transfer device 1100 is composed of a series of sub-test circuits, and each pick-up head 1120 corresponds to a sub-test circuit, which is composed of test electrodes 1134A, 1134B and circuits 1132A, 1132B. A pair of through-hole structures are formed at a place of the base substrate 1110 approaching the pick-up head 1120, and the through holes are filled with conductive materials to form circuits 1132A and 1132B to connect the test electrodes 1134A, 1134B to the CMOS integrated circuit 1140 on the second surface 1100B of the base substrate. The test electrodes 1134A and 1134B are embedded in the dielectric layer 1126, and the lower surface is parallel with the lower surface of the dielectric layer 1126. At this time, the surface 1120A of the pick-up head 1120 for contacting with the micro element is composed of test electrodes 1134A, 1134B and the dielectric layer 1126, as shown in FIG. 1. When the surface 1120A of the pick-up head 1120 contacts with the micro element, the test electrode 1134A contacts with the micro element electrode 1220A, and the test electrode 1134B contacts with the micro element electrode 1220B.

Figure 3:
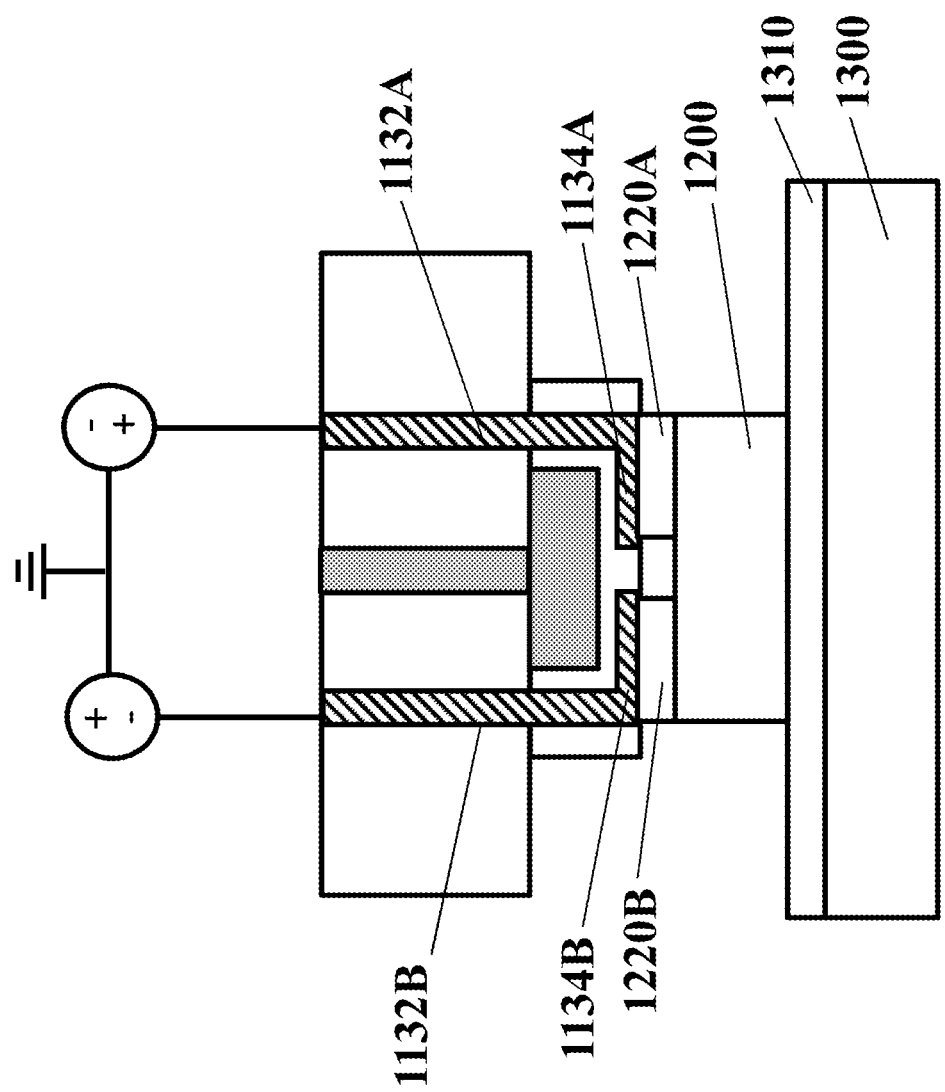
FIG. 3 is a schematic diagram showing that voltage is applied on the test circuit of the transfer device as shown in FIG. 1 to form a test hoop.

The transfer device 1100 of this embodiment mainly targets at micro elements 1200 with electrodes at same side (for example, micro light emitting diode with electrodes at same side), and the test electrodes 1134A and 1134B are formed on the surface 1120A of the pick-up head 1120 for contacting with the micro element. Before transferring the micro element 1200 with the transfer device 1100, the micro element 1200 is generally placed on the carrier substrate 1300 (a middle layer 1310 can be set between them, but is not necessarily required), wherein, electrodes 1220A and 1220B are generally placed upwards. When the pick-up head 1120 of the transfer device 1100 aligns with the contact micro element 1200, the test electrode 1134A contacts with the micro element electrode 1220A, and the test electrode 1134B contacts with the micro element electrode 1220B. When test voltage is applied on test electrodes 1134A and 1134B through circuits 1132A and 1132B, a test hoop is formed, as shown in FIG. 3 to realize photoelectric parameter test for the micro element. Thus, the micro elements are tested during transferring for prior removal of defect micro elements.

Figure 4:
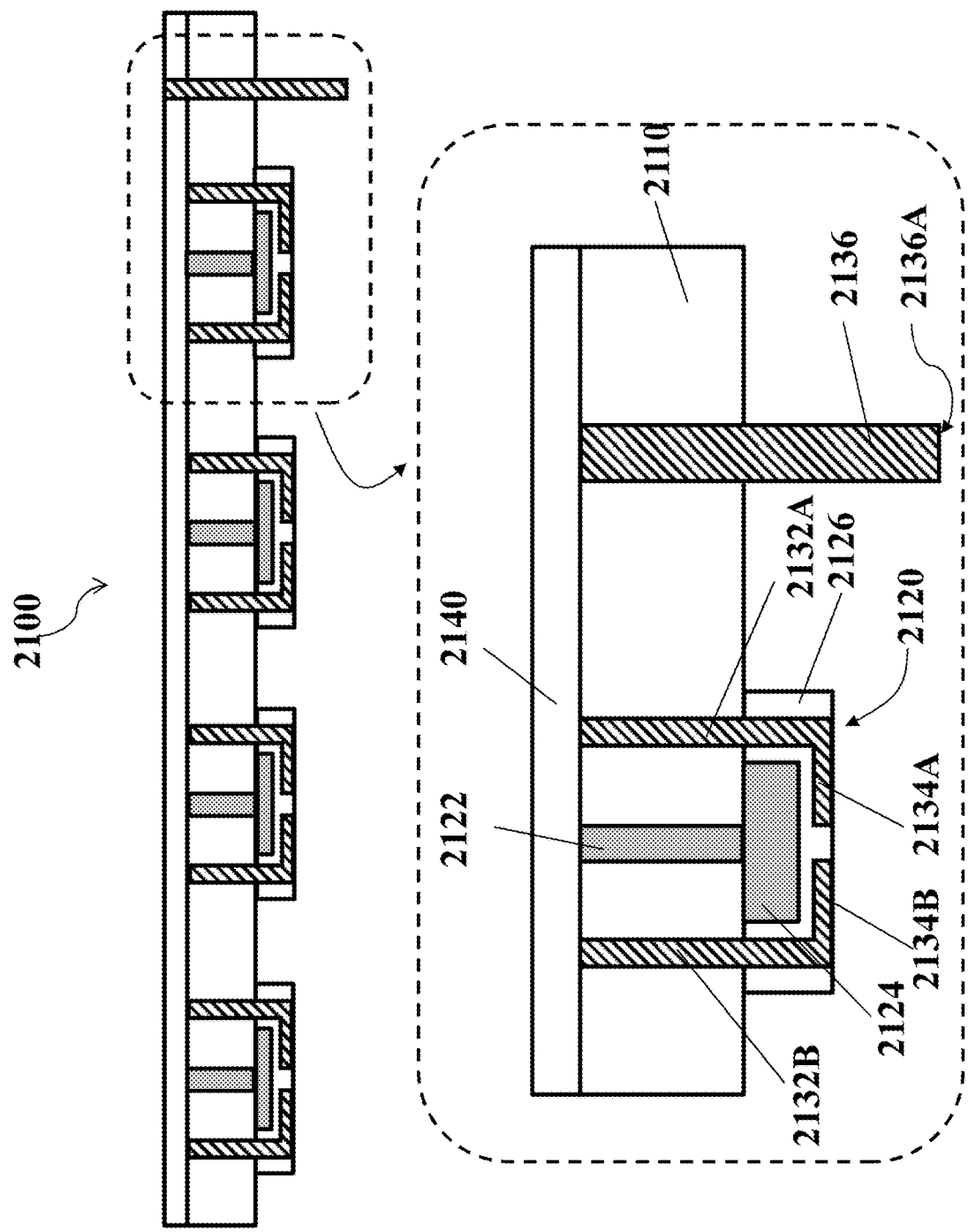
FIG. 4 is a side sectional view of a transfer device of micro element according to a second embodiment of the present disclosure.
Figure 5:
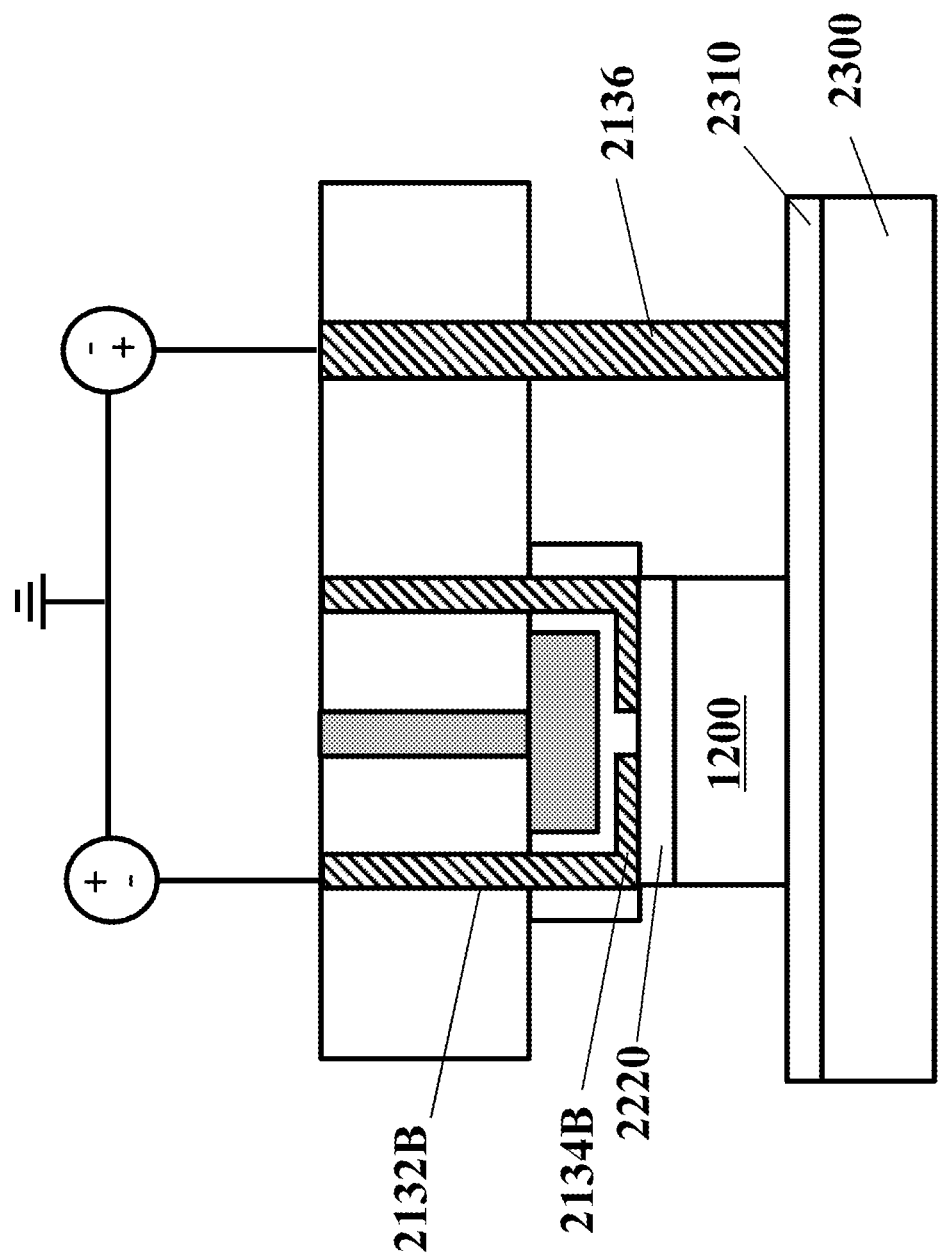
FIG. 5 is a schematic diagram showing that voltage is applied on the test circuit of the transfer device as shown in FIG. 4 to test the micro element.
Figure 6:
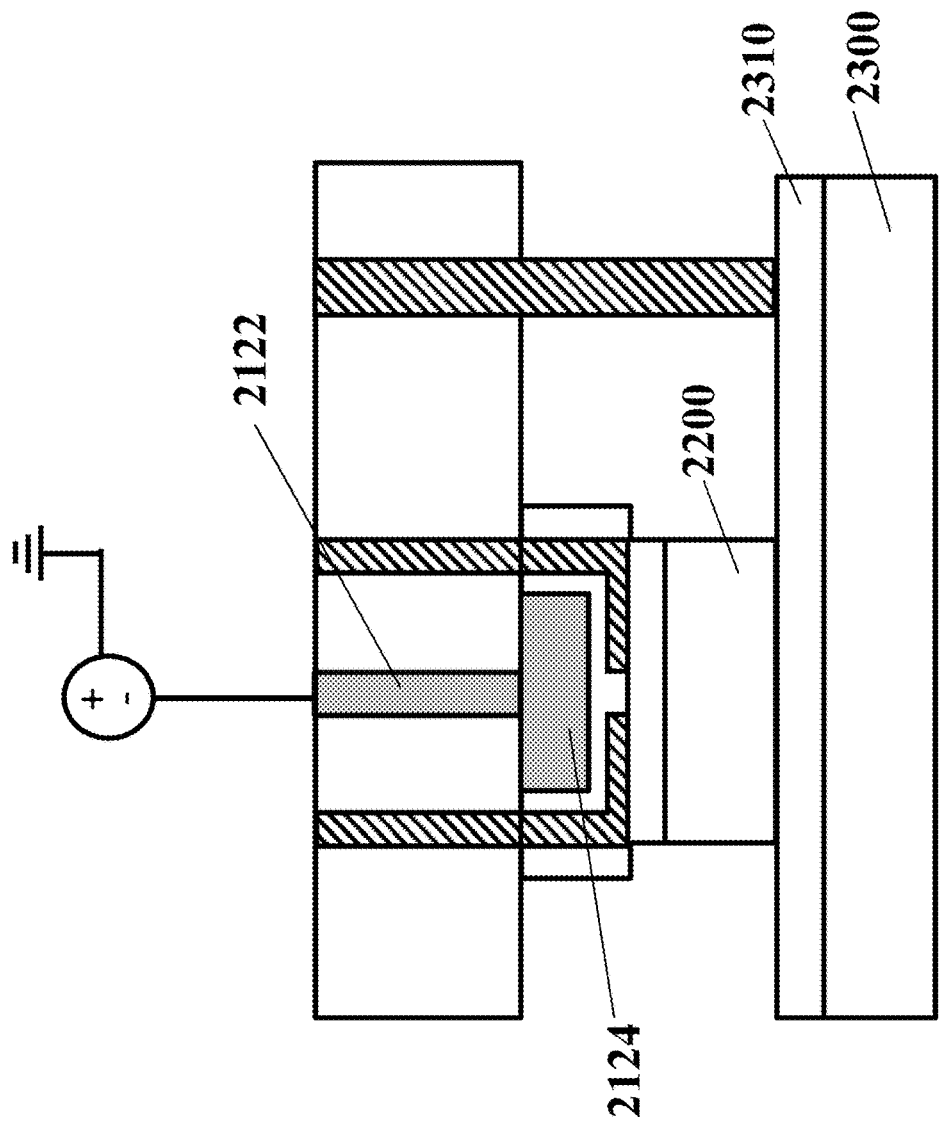
FIG. 6 is a schematic diagram showing that voltage is applied on the electrode layer of the pick-up head of the transfer device as shown in FIG. 4 to produce statistic absorption force.

FIG. 4 is a side section view of a transfer device according to the second preferred embodiment of the present invention. Different from the transfer device 1100, the transfer device 2100 also has at least a retractable electrode 2136, which forms a sub-test circuit together with the test electrode 2134B formed over the surface of the pick-up head for contacting with the micro element, which can be applied for micro elements with electrodes at different sides, such as a vertical micro light emitting diode. The retractable electrode 2136 and the pick-up head 2120 are at the same side, which can be located outside the array of the pick-up head 2120, and the lower end 2136A extrudes the lower end 2120A of the pick-up head 2120. When the transfer device 2100 is used for transferring the vertical micro element, the vertical micro element 2200 is placed on the conductive carrier substrate 2300, and the pick-up head 2120 of the transfer device 2100 orients to and contacts with the micro element 2200, then the test electrode 2034B contacts with the top electrode 2220 of the micro element 2200, and the retractable electrode 2136 contacts with the carrier substrate 2300. FIGS. 5 and 6 show circuit connections under the test mode and the pick-up mode. Referring to FIG. 5, when the transfer device 2100 tests the micro element, test voltage connects the test electrode 2134B and the retractable electrode 2136, wherein, 2134B connects the top electrode 2220 of the micro element, and the retractable electrode 2136 connects the conductive substrate 2300 to form a test hoop to realize test for the micro element 2200; referring to FIG. 6, when the transfer device 2100 picks up the micro element, when the absorption voltage connects the electrode layer 2124 of the electrostatic circuit, static attraction force is generated on the surface of the pick-up head 2120 to pick up the micro element contacted therewith.

The transfer device of the embodiment can be used for testing and transfer printing of micro elements with electrodes at same or different sides (namely, the vertical micro element). When the transfer device is applied for transferring the vertical micro element, the test electrode 2134B and the retractable electrode 2136 form a test circuit; when the transfer device is applied for transferring horizontal micro elements, the test electrodes 2134B and 2134A form a test circuit. The retractable electrode 2136 can be used for electrostatic protection.

Figure 7:
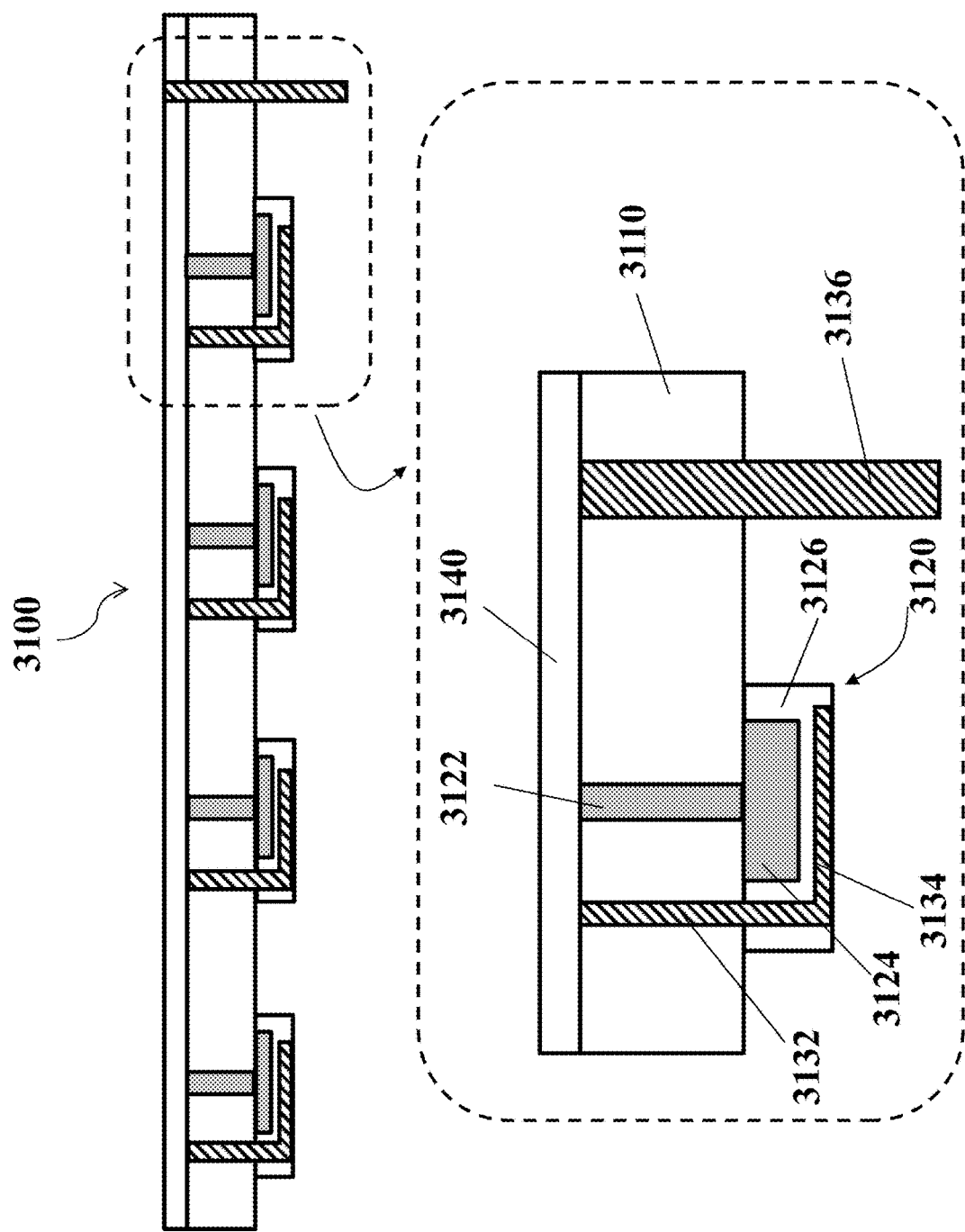
FIG. 7 is a side sectional view of a transfer device of micro element according to a third embodiment of the present disclosure.

FIG. 7 is a side section view of a transfer device according to the third preferred embodiment of the present invention. Different from the transfer device 2100, the transfer device 3100 is mainly applied for vertical micro elements. In this embodiment, the test circuit is simplified as only one test electrode 3134 forms on the surface of the pick-up head 3120.

Figure 8:
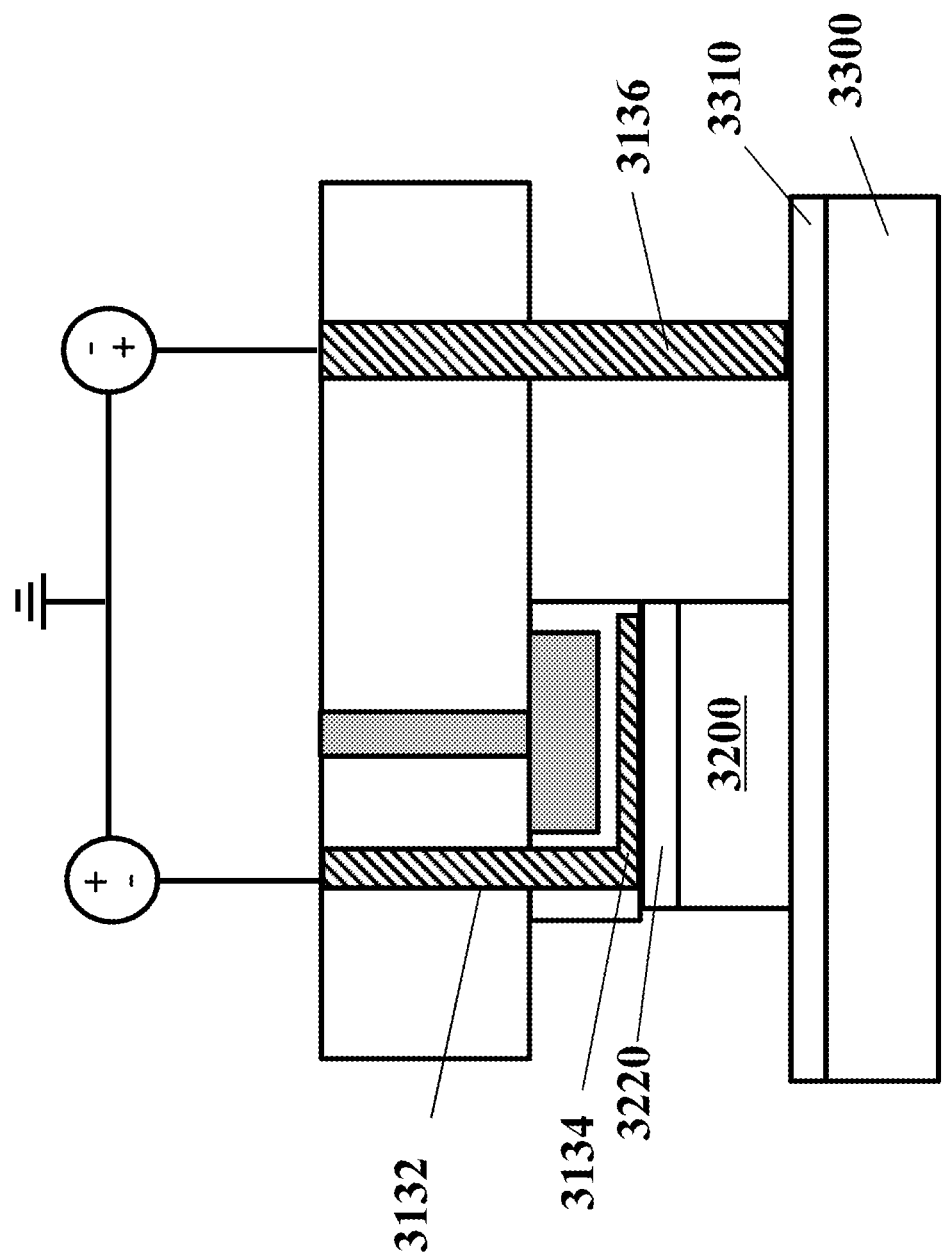
FIG. 8 is a schematic diagram showing that voltage is applied on the test circuit of the transfer device as shown in FIG. 7 to test the micro element.
Figure 9:
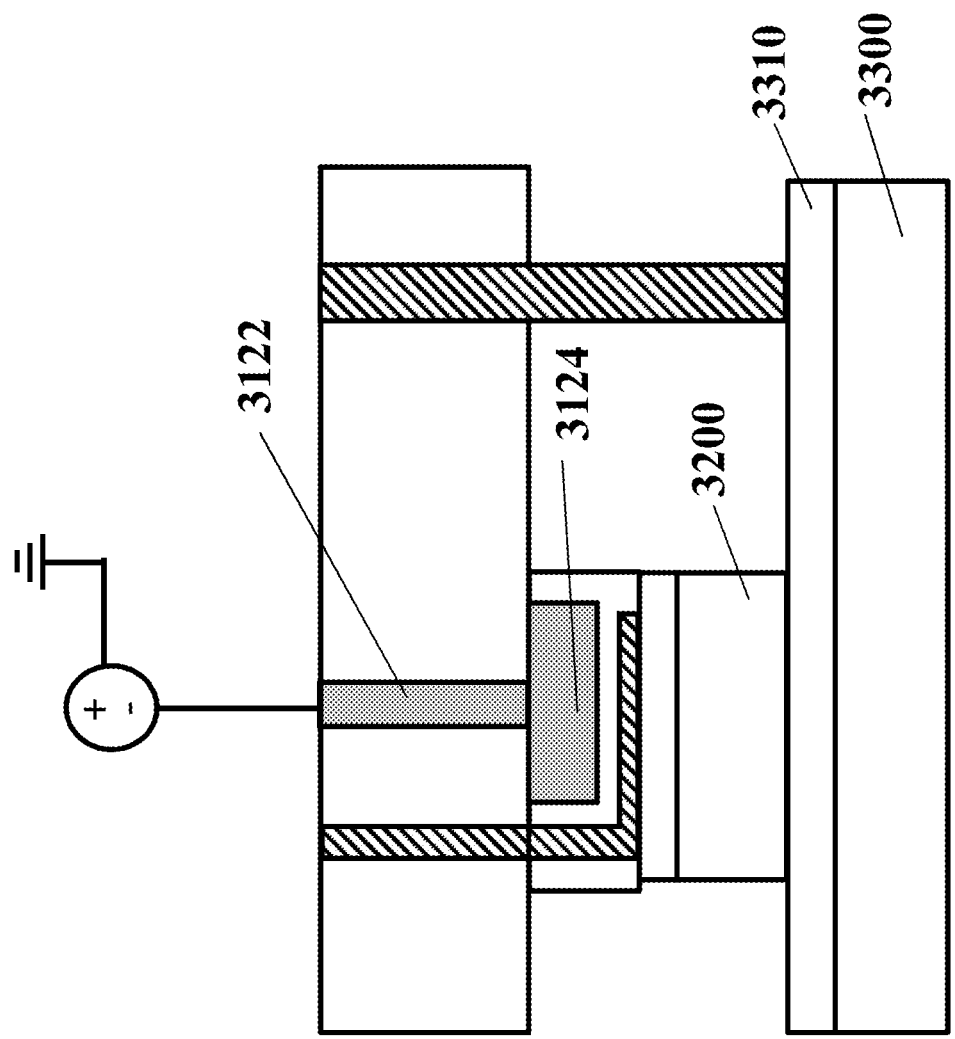
FIG. 9 is a schematic diagram showing that voltage is applied on the electrode layer of the pick-up head of the transfer device as shown in FIG. 7 to produce statistic absorption force.

FIGS. 8 and 9 show circuit connections under the test mode and the pick-up mode. Referring to FIG. 8, when the transfer device 3100 tests the micro element, the test voltage connects the test electrode 3134 and the retractable electrode 3136, wherein, the test electrode 3134 connects the top surface electrode 3220 of the micro element, and the retractable electrode 3136 connects to the conductive carrier substrate 3300 to form a test hoop for testing the micro element 3200; referring to FIG. 9, when the transfer device 2100 picks up the micro element 3200, one end of the external power is directly grounded, and the other end connects to the electrode layer 3124. Static attraction force is produced on the surface of the pick-up head 3120 to pick up the micro element contact therewith.

Figure 10:
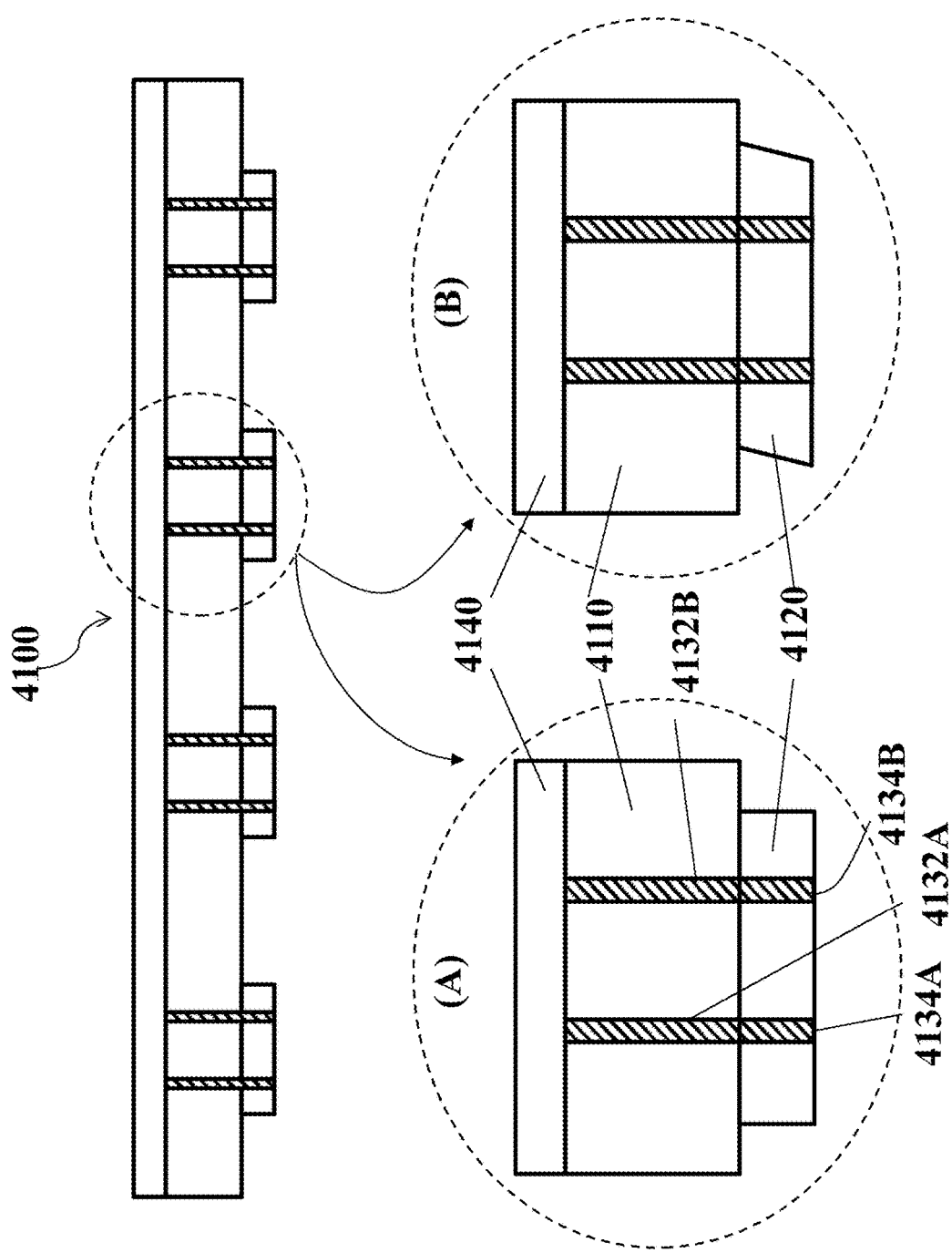
FIG. 10 is a side sectional view of a transfer device of micro element according to a fourth preferred embodiment, wherein the surface of the pick-up head 4120 has a micro nanometer-composite rigid villi structure.

FIG. 10 is a side section view of a transfer device according to the fourth preferred embodiment of the present invention. Different from the transfer device 1100, the pick-up head 4120 of the transfer device 4100 picks up and releases the micro element with Van der Waals force. In this embodiment, the surface of the pick-up head 4120 is made of biomimetic gecko. When it orients to and contacts with the micro element, the pick-up head absorbs the micro element by virtue of absorption capacity of the biomimetic gecko to pick up required micro element, and desorbs the micro element by virtue of desorption capacity the biomimetic gecko to release the micro element. In this embodiment, the test electrodes 4314A and 4134B are not necessarily to cover the surface of the pick-up head 4120, but to expose part of the test electrode on the surface of the pick-up head for contacting with the micro element to the extent that the test electrode can be connected to the micro element electrode when the pick-up head 4120 contacts the micro element.

Figure 11:
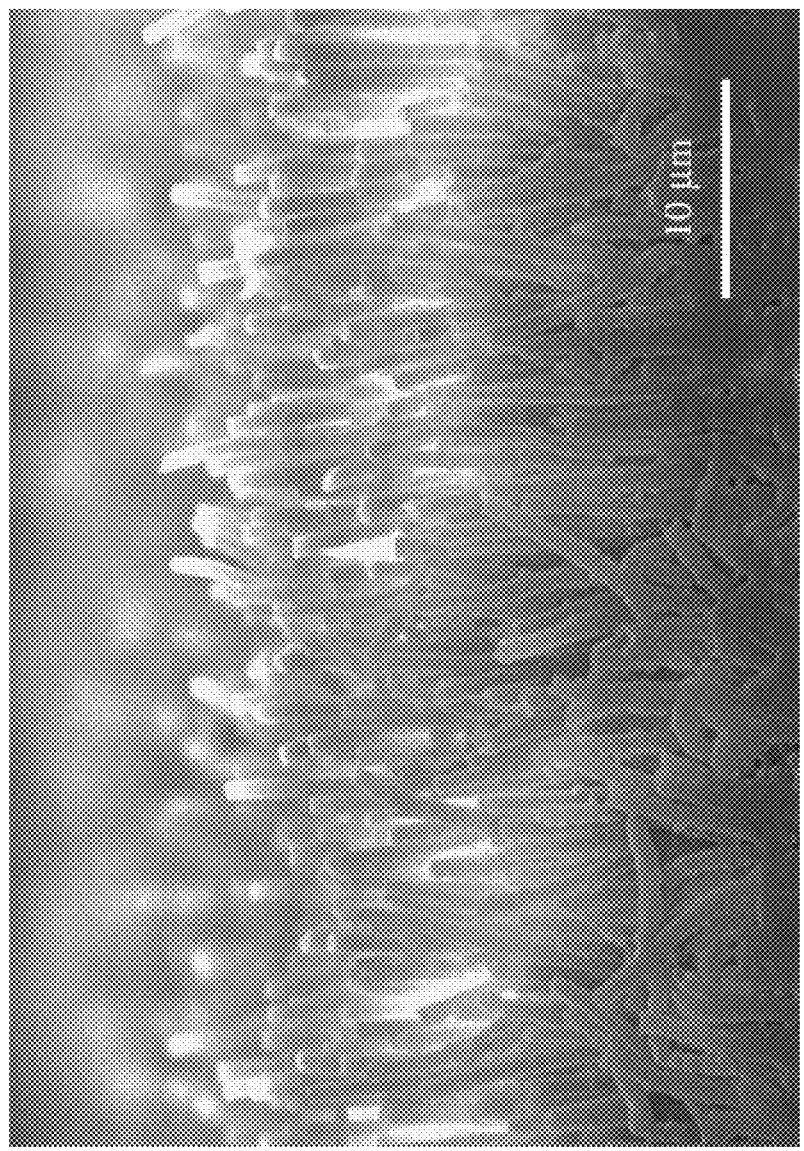
FIG. 11 is a SEM diagram of the rigid villi structure of the micro element transfer device as shown in FIG. 10.

Specifically, the pick-up head 4120 is made of biomimetic gecko material, which can be silicone rubber, polyurethane, multiwalled carbon nanotube, polyester resin, polyimide, artificial rubber, epoxy resin, polydimethylsiloxane, polyurethane and ethylene glycol terephthalate or polymethyl methacrylate or any of their combinations. Further, the surface of the pick-up head 4120 comprises micro nanometer-composite rigid villi structure, as shown in FIG. 11, for example, with protrusion density of $1\times10^5$-$6\times10^8$ protrusions per $cm^2$. Van der Waals force is produced when the rigid villi structure made of biomimetic gecko material contacts with the micro element surface with adhesive attraction, which absorbs the micro element to pick up the micro element. In some embodiments, the surface of the rigid villi structure has hydrophobic nature, which prevents water layer from being formed on the contact surface, which eliminates possible function of capillary force as much as possible, thus playing an important role for narrowing gap and providing Van der Waals force.

Figure 12:
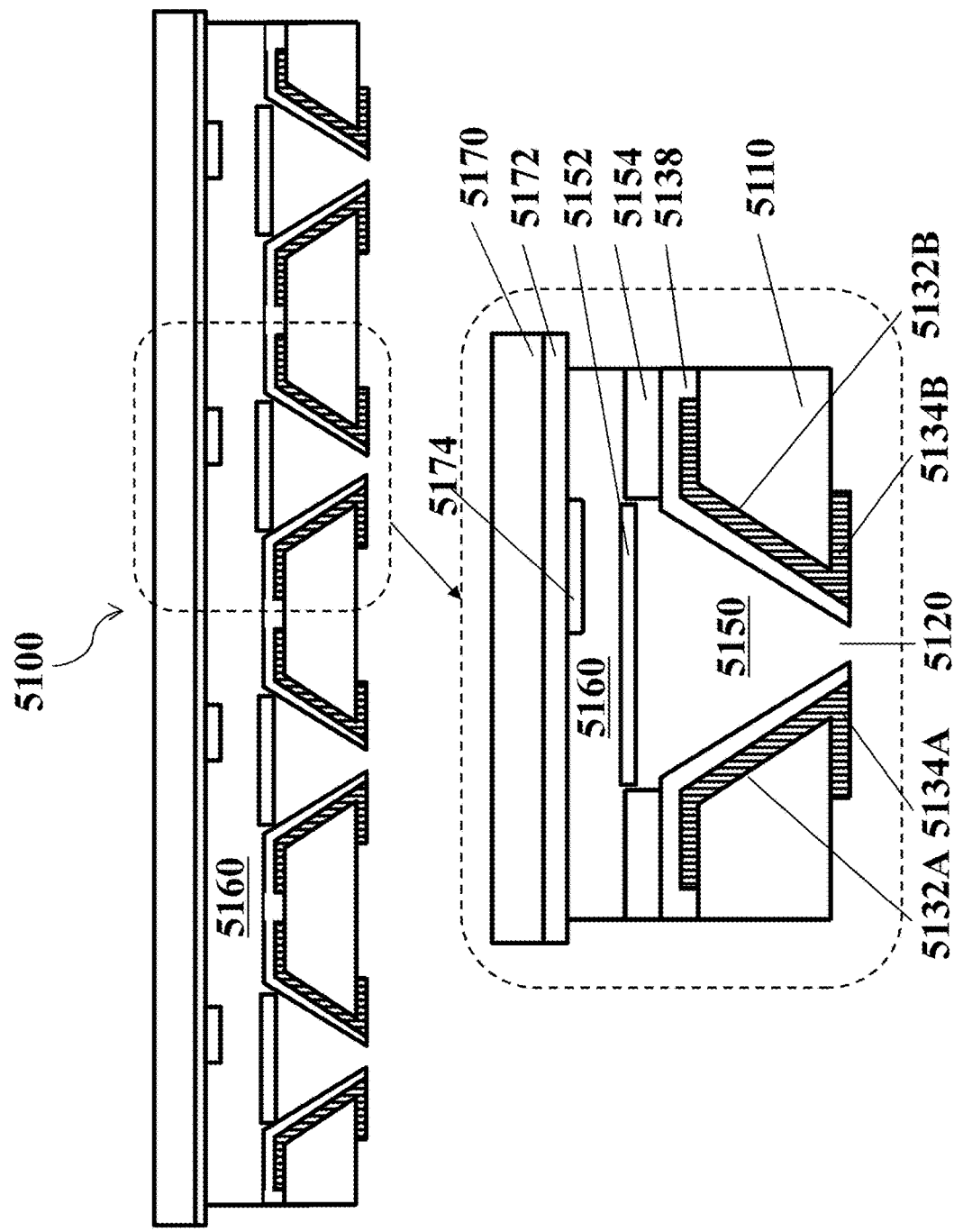
FIG. 12 is a side section view of a transfer device of micro element according to a fifth preferred embodiment.

FIG. 12 is a side section view of a transfer device according to the fifth preferred embodiment of the present invention. Different from the transfer device 1100, the pick-up head 5120 of the transfer device 5100 is a suction nozzle structure, which picks up and releases the micro element through vacuum pressure adsorption. Specifically, the transfer device 5100 has a suction nozzle array. Each suction nozzle is connected to a same cavity 5160 through the vacuum path 5150, and each vacuum path has a valve 5152 to control ON/OFF of the vacuum path. Size (for example length or width) of each suction nozzle is 1-100 µm. Each suction nozzle is 1-20 µm. Pitch of the suction nozzle array is (1 µm-100 µm)×(1 µm-100 µm), for example 10 µm×10 µm or 50 µm×100 µm. To reach such size, each vacuum path can be a series of micro-hole structures formed over the base substrate 5110 (such as Si substrate). Correspondingly, each suction nozzle 5120 corresponds to a vacuum path 5150, a valve 5152 and a switch element. A CMOS storage circuit and an address electrode array can be used for providing the switch array with micro size.

Digital micro-mirror device (DMD) is a single chip semiconductor device with micro electro mechanical system (MEMS), which generally comprises area arrays of bistable state movable micro-mirror for forming image elements (pixel). The micro-mirror is fabricated in the area array corresponding to the addressing memory unit and placed above related address electrode at the bottom of the micro-mirror, wherein, the address electrode is under selective excitation by the control circuit to generate electrostatic attraction causing corresponding micro-mirror to deflect towards corresponding address electrode. The embodiments, with the principle of DMD chip, a movable member of a micro-mirror similar to the DMD chip is set at the connection position of each vacuum path and the shared cavity, as a valve, and an associated address electrode is fabricated above the movable member, wherein, the address electrode is under selective excitation by the control circuit to generate electrostatic attraction causing corresponding movable member to deflect towards corresponding address electrode. In this way, the movable member skews or deflects to the address electrode to close or open the vacuum path, and controls each vacuum path valve via the switching component for controlling opening or closing of the vacuum path to extract required micro element.

Referring to FIG. 12, the transfer device 5100 comprises a base substrate 5110, a cavity 5160 above the base substrate 5110 and a switch array above the cavity 5160. Specifically, the base substrate 5110 has an array of through hole 5150, and a series of suction nozzle structures are formed at the bottom surface of the base substrate 5110 to serve as the pick-up head 5120. Conductive layers 5132A and 5132B are formed at the side wall of the through hole 5150, and extend towards the upper and lower surfaces of the base substrate 5110. Test electrode 5134A and 5134B are formed on the lower surface of the base substrate 5110. Cover a dielectric layer over the conductive layers 5132A and 5132B as the insulating protective layer 5138. The conductive layers 5132A, 5132B and the test electrodes 5134A, 5134B form a test circuit, wherein, a functional circuit (such as a CMOS integrated circuit, not shown) can be formed inside the base substrate 5110 for connecting the test circuit. In this embodiment, each suction nozzle 5120 is connected to a same cavity 5160 through the through hole 5150. As the vacuum path, each through hole 5150 is used for transmitting vacuum pressure so that the suction nozzle 5120 can absorb or release the micro element through vacuum pressure. Further, a valve 5152 is set at the opening of each through hole 5150 for controlling ON/OFF of each vacuum path 5150. The valve of each vacuum path is controlled by the switch component so as to control ON or OFF of the vacuum path to pick up required micro element. The switch array is composed of a CMOS storage circuit layer 5170 and an address electrode layer 5172 thereunder, wherein, the address electrode layer 5172 is provided with an array of address electrode 5174, each address electrode 5174 corresponding to a vacuum path 5150.

In this embodiment, the valve 5152 is a member 5152 capable for deflection at the micro hole structure, wherein, the edge of this member is not connected to the through hole edge, but connects to the base substrate 5110 with a carrier layer 5154. Under electrostatic attraction of the address electrode 5174, the member 5152 deflects taking the pivot as the center, wherein, one end deflects towards the address electrode 5174.

Figure 13:
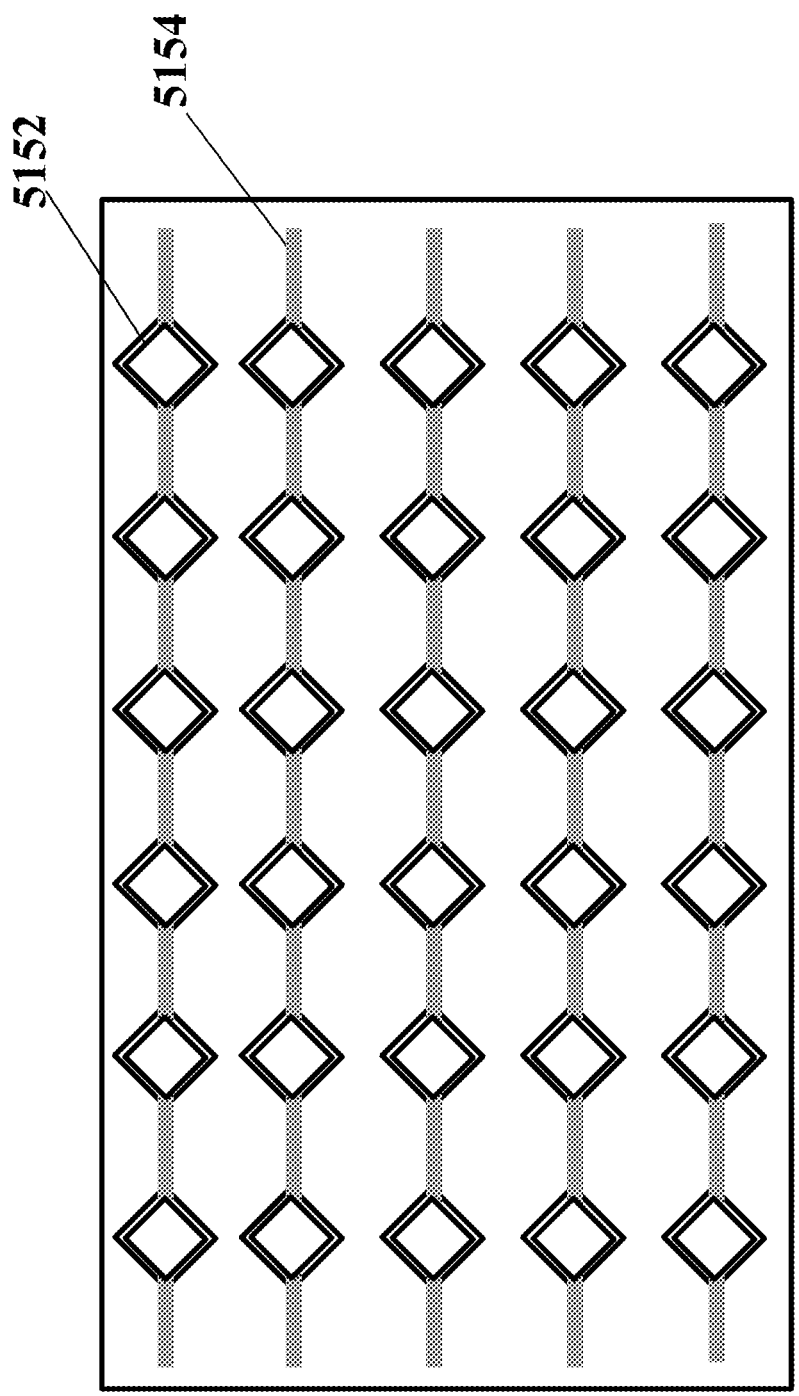
FIG. 13 is a first schematic diagram illustrating the vacuum path valve of the micro element the transfer device.
Figure 14:
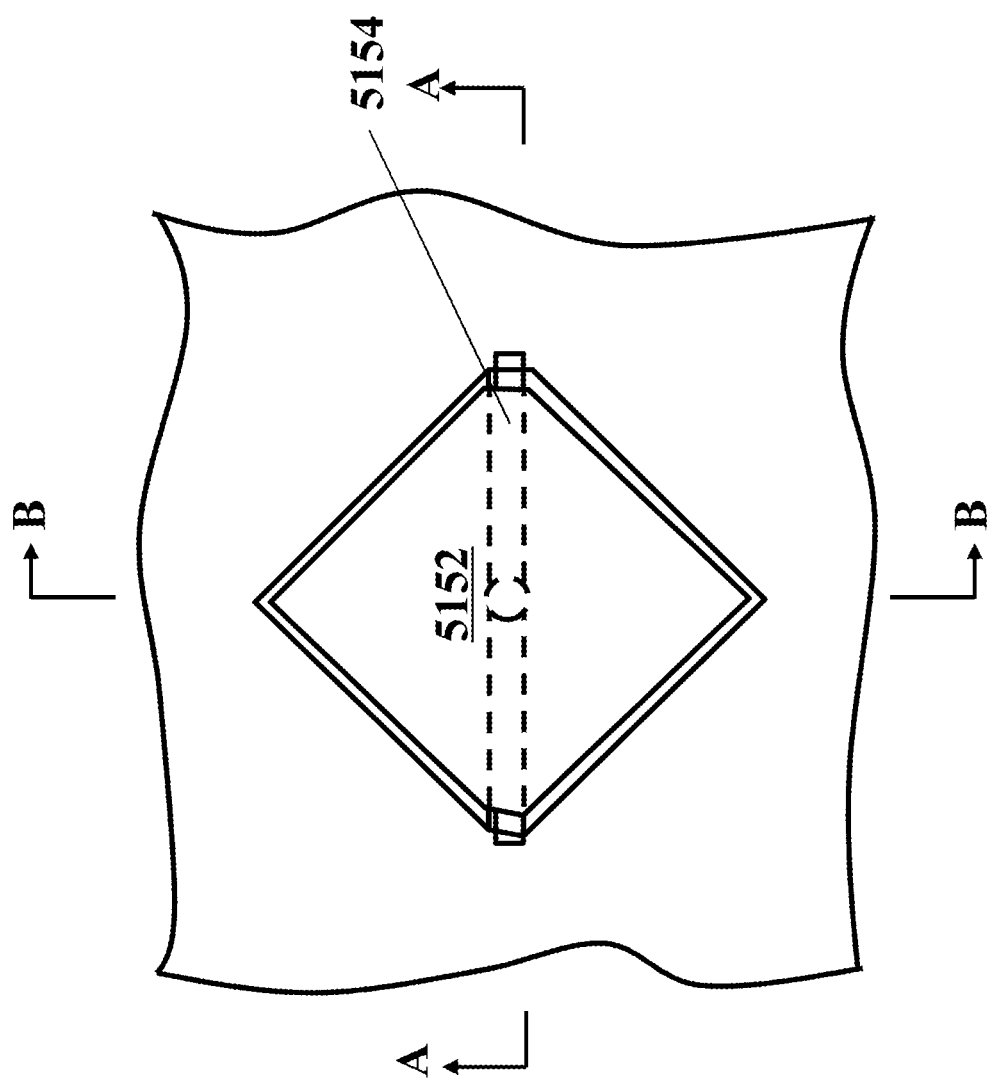
FIG. 14 is a second schematic diagram illustrating the vacuum path valve of the micro element the transfer device.
Figure 15:
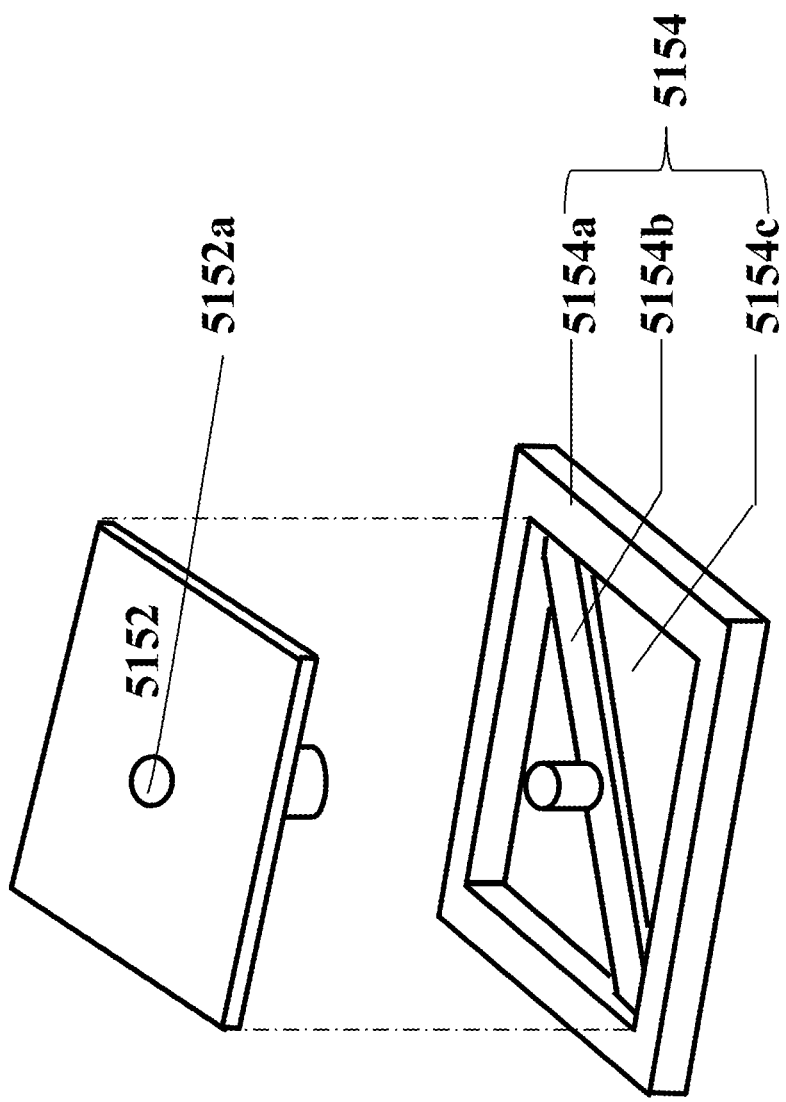
FIG. 15 is a third schematic diagram illustrating the vacuum path valve of the micro element the transfer device.

FIGS. 13-15 are schematic diagrams of the vacuum path valve. The valve structure comprises a carrier layer 5154 on the surface of the base substrate 5110 and a movable member 5152 on the carrier layer 5154. The carrier layer 5154 comprises a frame 5154*a*, a pivot 5154*b* and an opening 5154*c*, wherein, the pivot 5154*b* is supported on the frame 5154*a* and cross the opening 5154*c*. The movable member 5152 is supported on the pivot 5154*b* through the hole 5152*a*, and can deflect or decline taking the pivot 5154*b* as the center.

Figure 16:
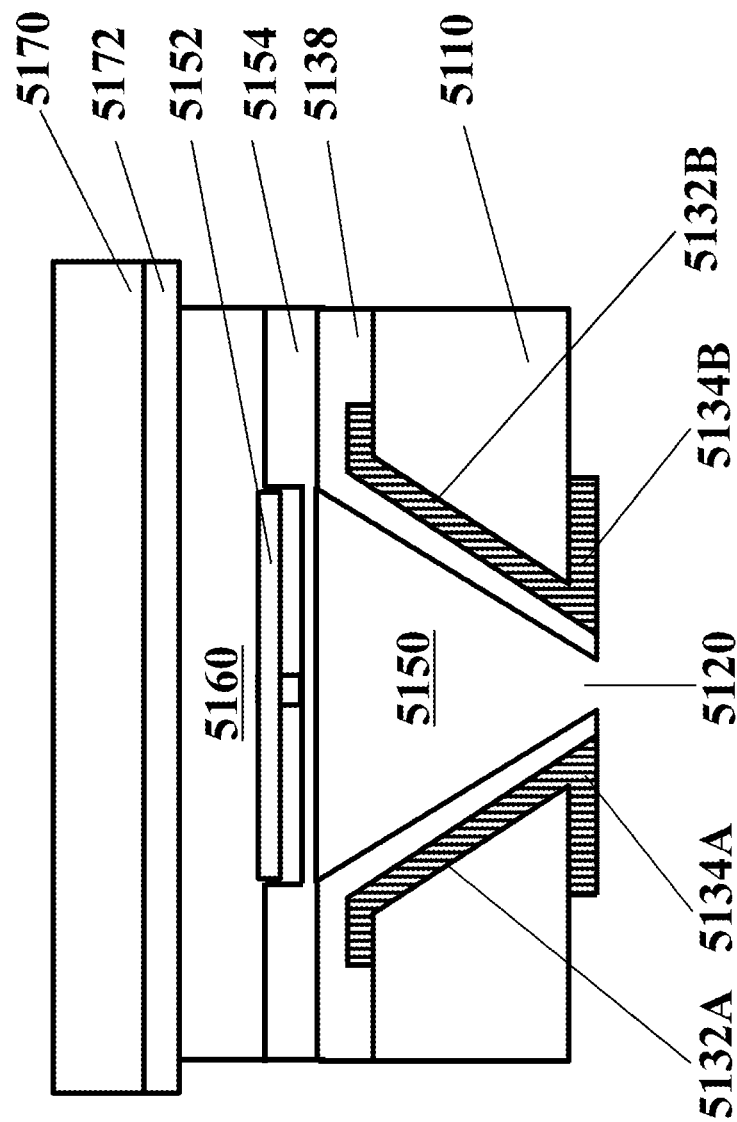
FIG. 16 is a cross-section view of FIG. 14 along line A-A.
Figure 17:
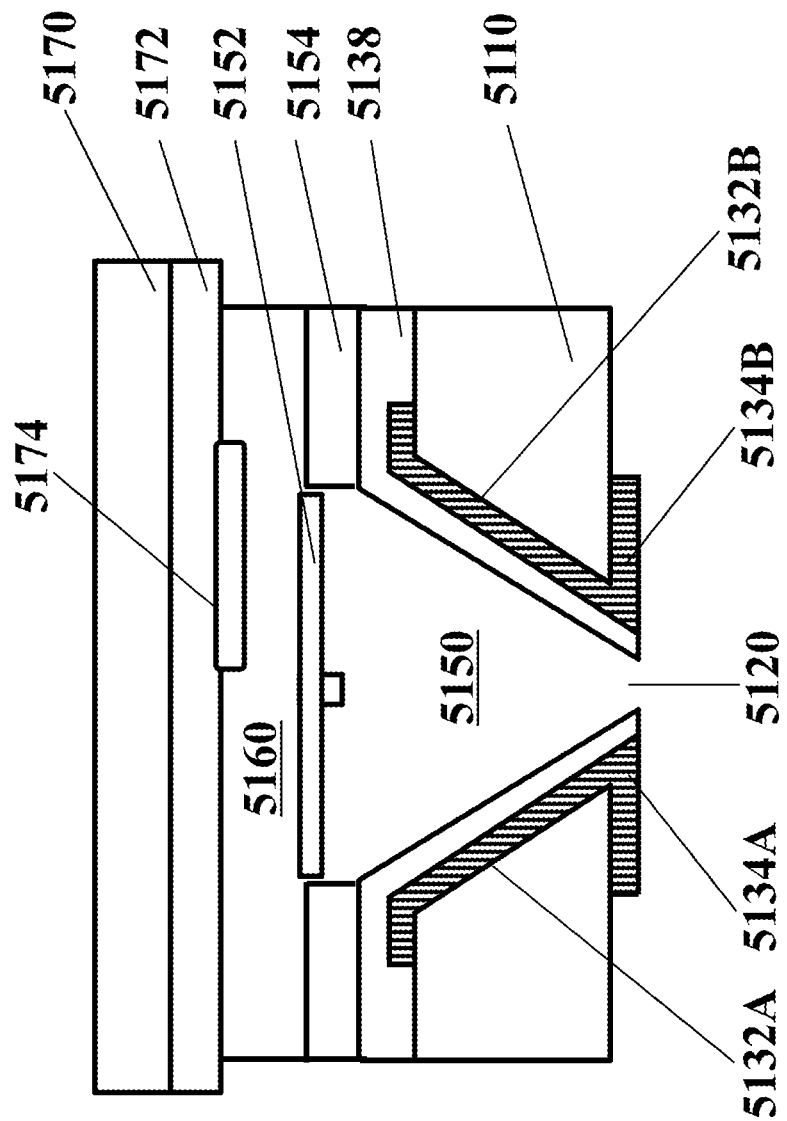
FIG. 17 is a cross-sectional view of FIG. 14 along line B-B, in which the vacuum path is OFF.
Figure 18:
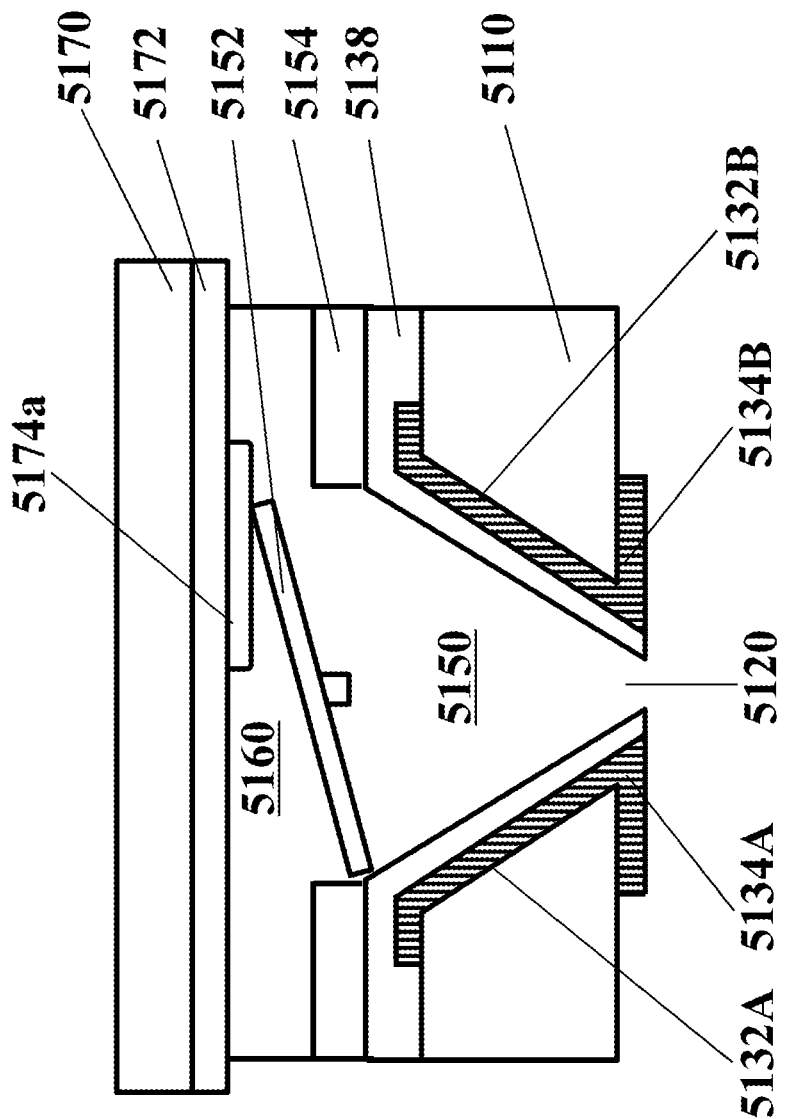

FIGS. 16-18 are section views of each suction nozzle of the transfer device. FIG. 16 is a schematic diagram along line A-A of FIG. 14. As shown in the figure, in this embodiment, the upper surface of the pivot 5154*b* is lower than the frame 5154*a*, and the component 5152 suspends on the pivot 5154*b*. FIGS. 17-18 are schematic diagrams along line A-A of FIG. 12. As shown in the figure, an address electrode 5174 is arranged above the member 5152. The CMOS memory circuit controls the ON/OFF status of the address electrode 5174. When the address electrode 5174 is in OFF status, the address electrode 5174 is not excited with voltage potential so as not to generate electrostatic attraction, and the member 5152 is not deflected, thus closing the vacuum path 5150, as shown in FIG. 17; when the address electrode 5174 is in ON status, the address electrode 5174 is excited with voltage potential to generate electrostatic attraction. Under electrostatic attraction of the address electrode 5174, the edge of the member 5152 deflects on the pivot 5154*b* and deflects towards the address electrode 5174, thus opening the vacuum path 5150, as shown in FIG. 18.

Figure 19:
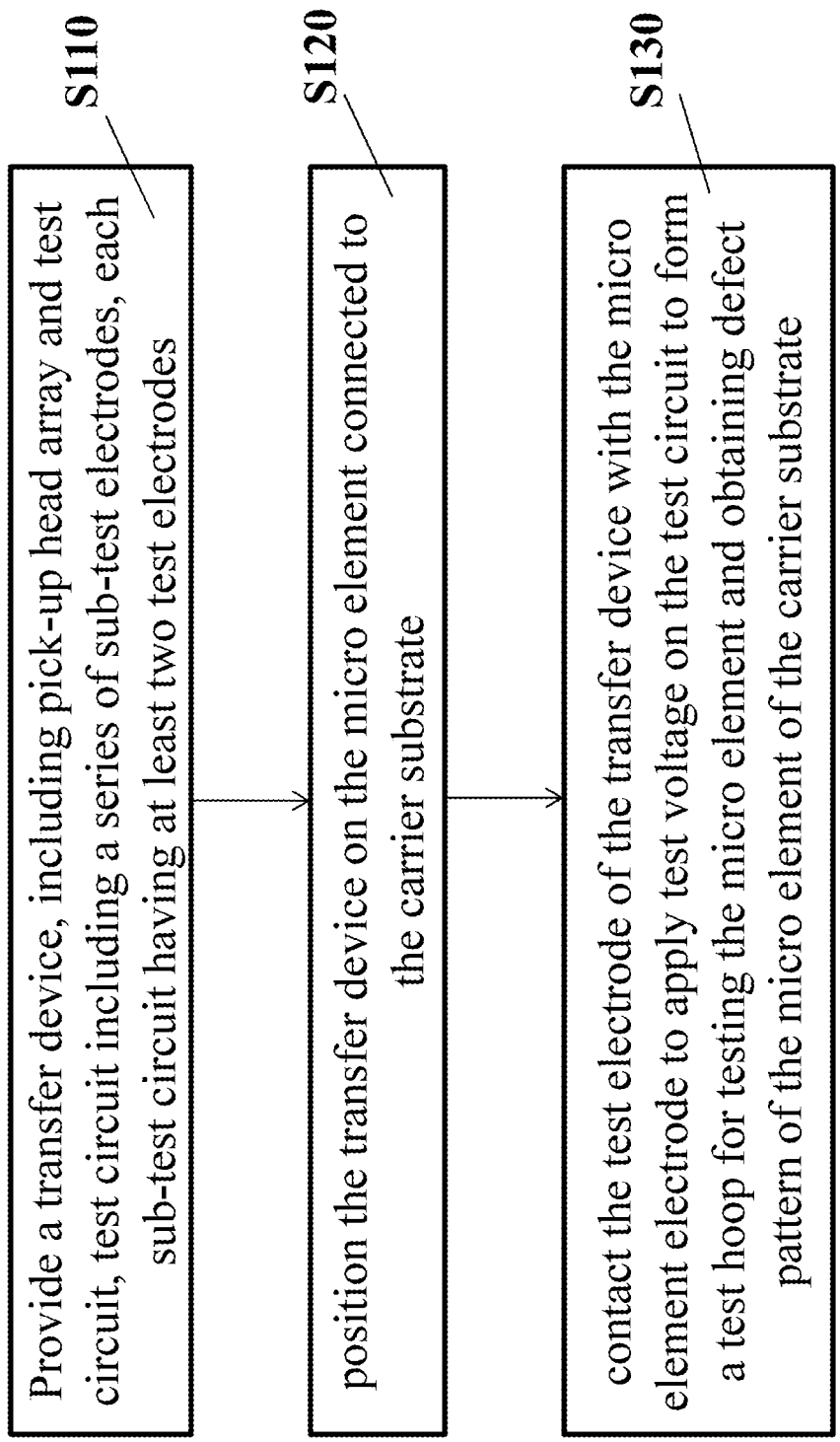
FIG. 19 is a flow chart illustrating prior removal of defects of a micro element during transfer according to the present invention.

FIG. 19 is a flow diagram of defect removal of the micro element through any of the aforesaid transfer device, which can include steps S110-S130. Brief description is given below.

S110: provide any of the transfer devices. The transfer device comprises a pick-up head array and a test circuit, wherein, the test circuit is composed of a series of sub-test electrodes, and each sub-test circuit corresponds to a pick-up head. In some embodiments, in general, the device comprises two test electrodes, wherein, at least one test electrode is located over the surface of the pick-up head for contacting with the micro element, so that when the pick-up head contacts with the micro element, the test electrode injects test current to the micro element.

S120: position the transfer device on the micro element connected to the carrier substrate. The carrier substrate can be a growth substrate or a carrier substrate; for example, the carrier substrate material can be glass, Si, polycarbonate (PC), acrylonitrile butadiene styrene (ABS) or any of their combination. The micro element can be a micro light emitting diode, with thickness of about 0.5 µm to about 100 µm. The micro element can be a cylinder with radius of about 0.5 µm to about 500 µm. However, the micro element is not limited to cylinder, but can be triangular column, cube, rectangular, hexagonal column, octagonal column or other polygonal cylinders.

S130: contact the test electrode of the transfer device with the micro element electrode to apply test voltage on the test circuit to form a test hoop for testing the micro element and obtaining defect pattern of the micro element of the carrier substrate. Through the test circuit of the transfer device, when the pick-up head array contacts with the micro element, the test electrode connects to the micro element electrode to form a test hoop.

During transferring of the micro element, test the micro element to obtain defect pattern of the micro element for selective pick-up of qualified micro elements or unqualified micro elements. The embodiment for a transfer method of micro element for prior removal of defects is described in detail with reference to figures below.

Figure 20:
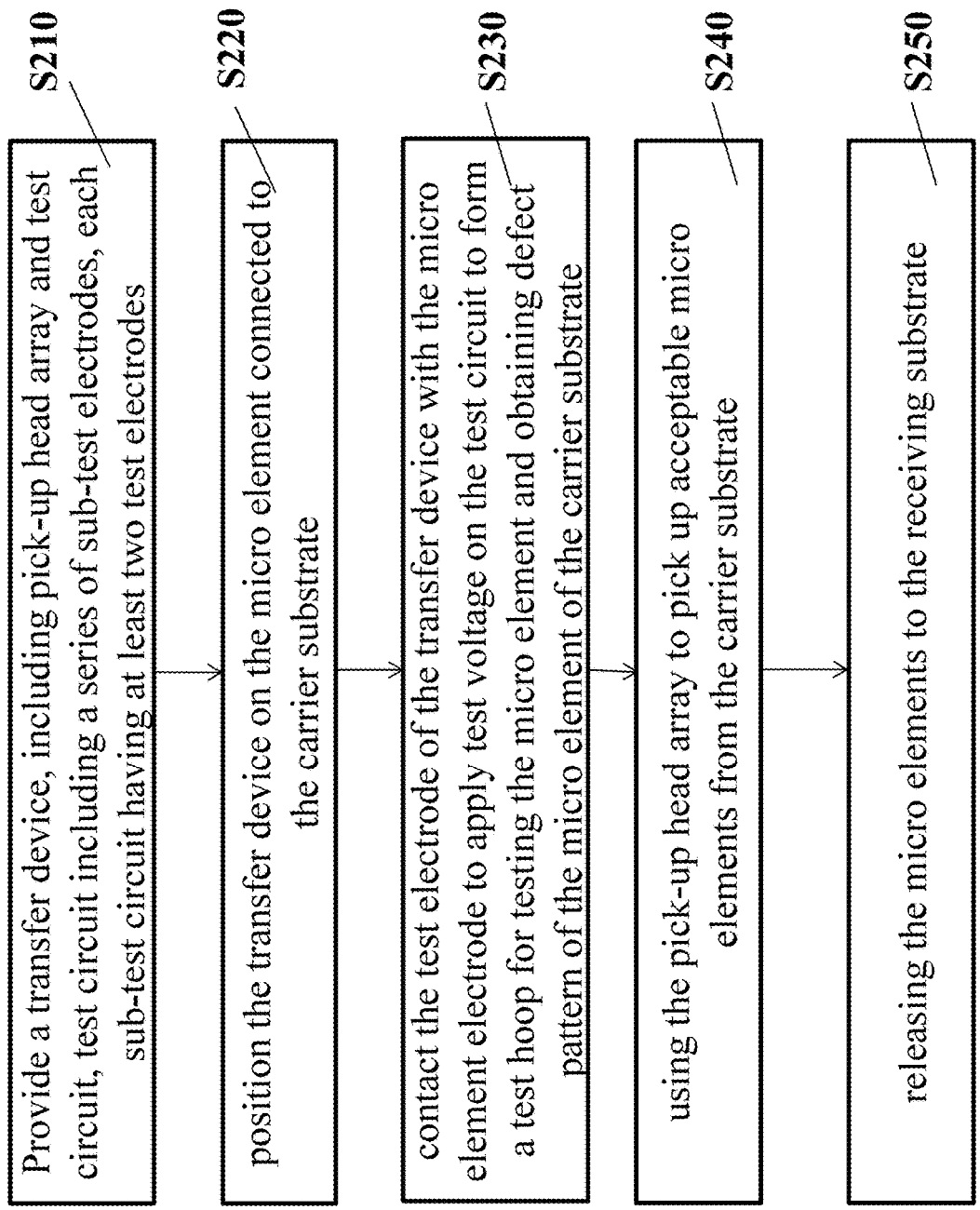
FIG. 20 is a flow chart illustrating the transfer method of the micro element according to a sixth preferred embodiment.

FIG. 20 is a schematic diagram of a transfer method of the micro element according to the sixth preferred embodiment of the present invention, comprises steps S210-S250. For example, S210 includes provide a transfer device, including pick-up head array and test circuit, test circuit including a series of sub-test electrodes, each sub-test circuit having at least two test electrodes.

S220 includes positioning the transfer device on the micro element connected to the carrier substrate.

S230 includes contacting the test electrode of the transfer device with the micro element electrode to apply test voltage on the test circuit to form a test hoop for testing the micro element and obtaining defect pattern of the micro element of the carrier substrate.

Figure 21:
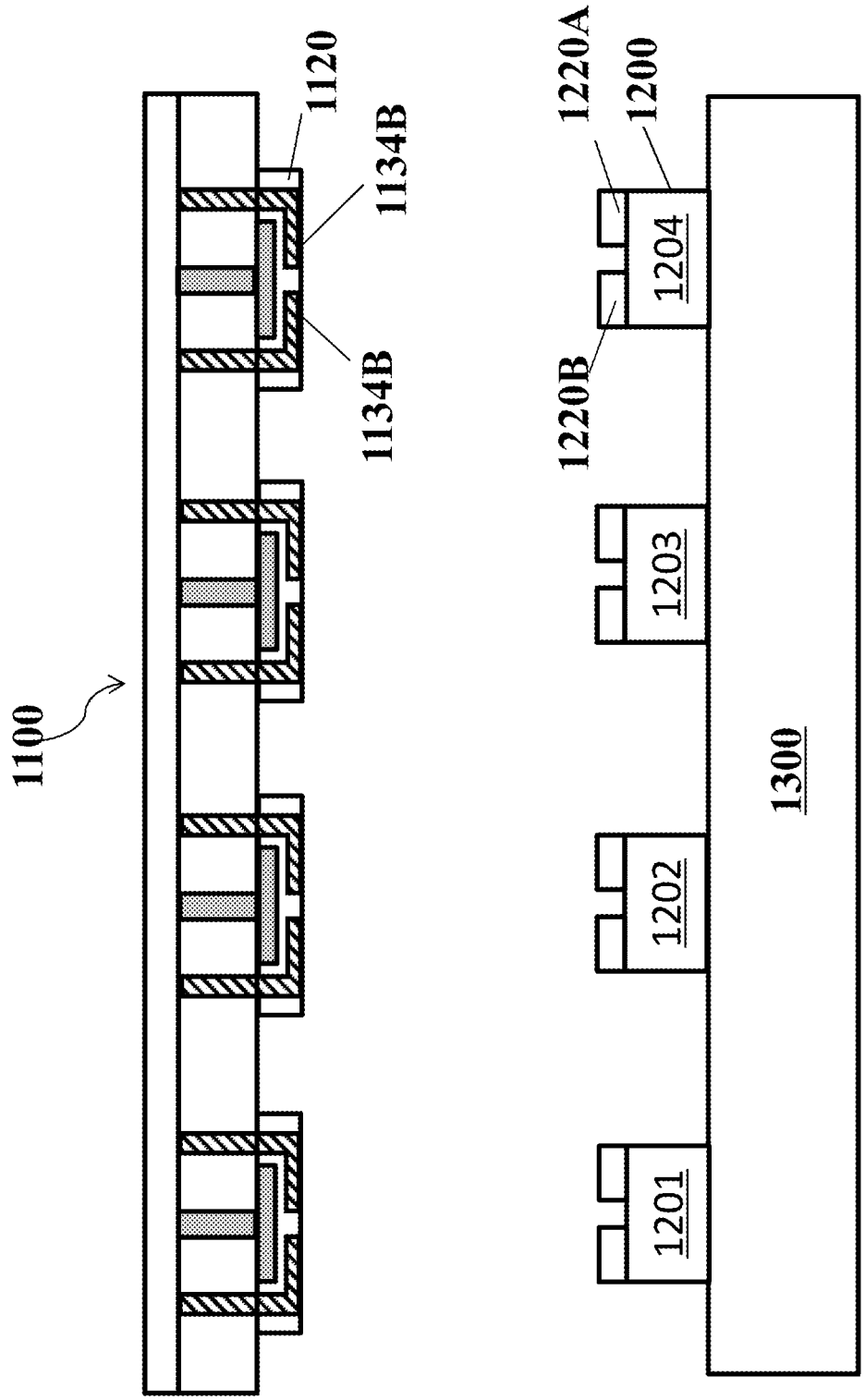
FIG. 21 illustrates a first step of the transfer method of the micro element according to the sixth embodiment.

S240 includes using the pick-up head array to pick up acceptable micro elements from the carrier substrate S250 includes releasing the micro elements to the receiving substrate Referring to FIG. 21, provide a transfer device 1100, and position it on the micro element 1200 which is connected to the carrier substrate 1300. Brief description is given below taking the transfer device 1100 of the first preferred embodiment of the present invention as an example. Place the micro element on the carrier substrate 1300, with electrodes upwards, and the test electrodes 1134A and 1134B of the transfer device 1100 align with the micro element electrodes 1120A and 1120B respectively. For simplification, the figure only shows four micro elements 1201-1204.

Figure 22:
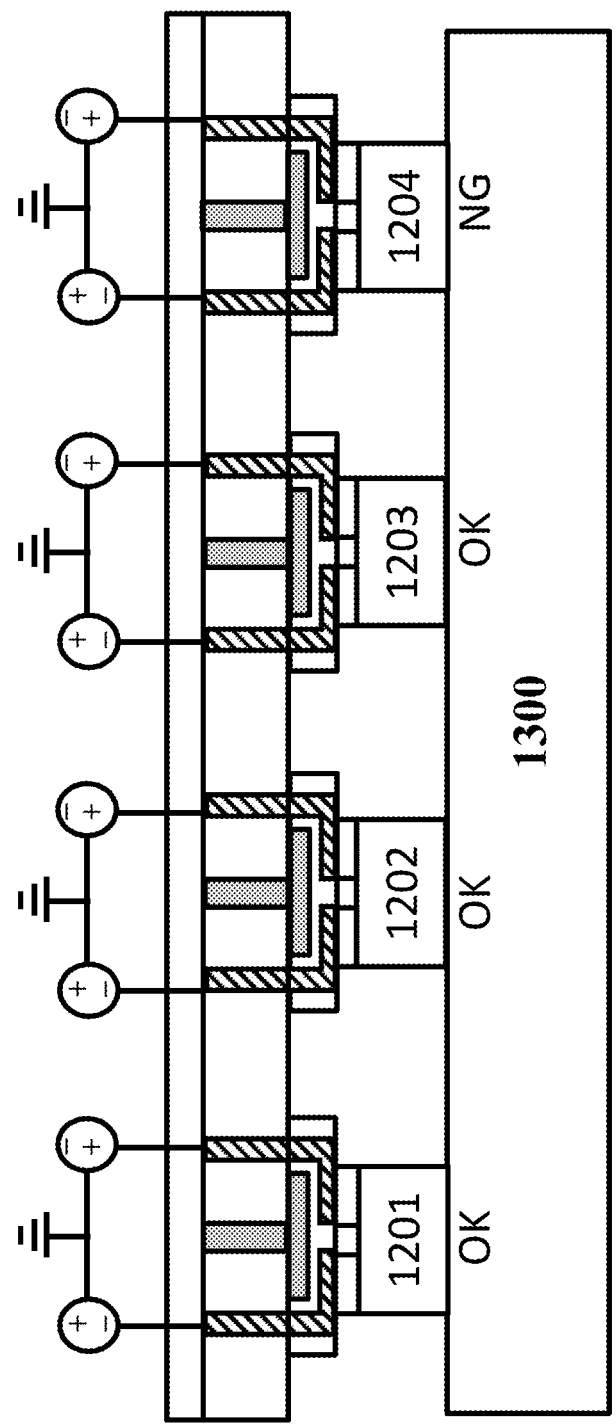
FIG. 22 illustrates a second step of the transfer method of the micro element according to the sixth embodiment.

Referring to FIG. 22, contact the pick-up head 1120 of the transfer device with the micro element. The test electrode is connected to the micro element electrode, and applies voltage on both ends of the test electrode to form a test loop for testing the micro element and obtaining defect patterns of the micro element. For example, photoelectric parameters of the micro element 1204 are qualified, and photoelectric parameters of the micro element 1201-1203 are not qualified.

Figure 23:
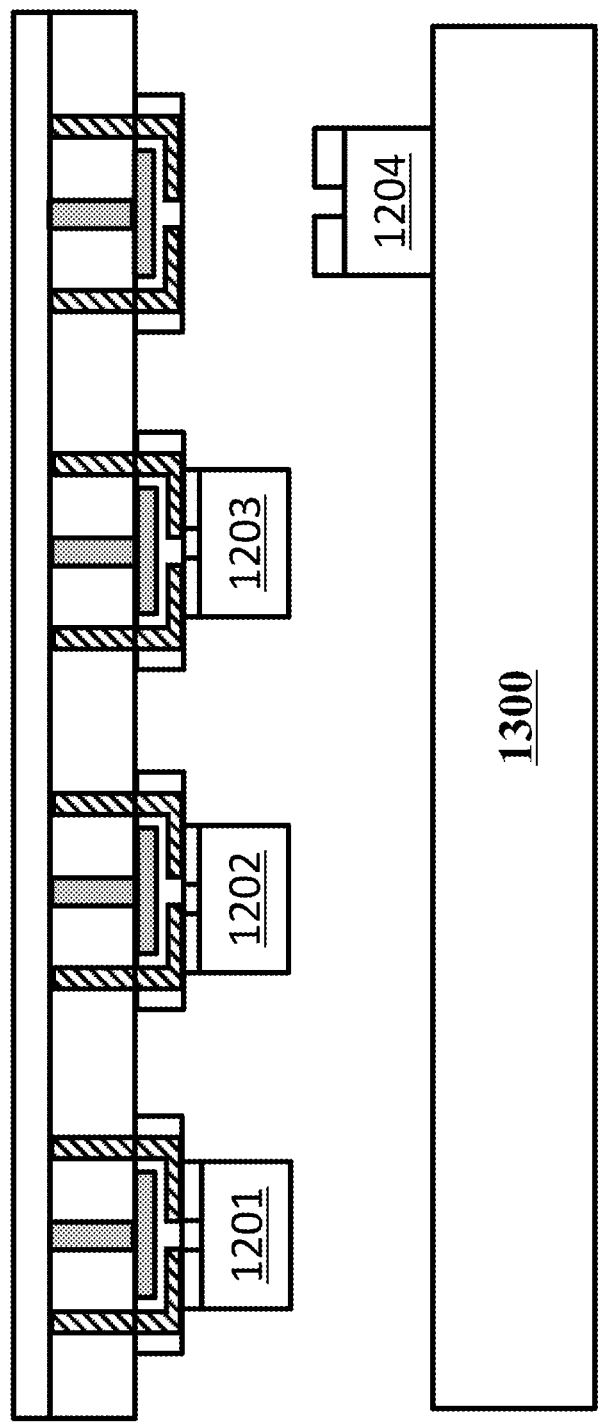
FIG. 23 illustrates a third step of the transfer method of the micro element according to the sixth embodiment.

Referring to FIG. 23, by controlling the pick-up head array of the transfer device, selectively pick up qualified micro elements 1201-1203 on the carrier substrate 1300. In this embodiment, the micro element array has 10 µm interval, wherein, each micro element has 2 µm interval and 8 µm maximum width. Top surface of each micro element has a width approximating to 8 µm, and width of the surface of the corresponding pick-up head for contacting with the micro element is near 8 µm or less, thus avoiding unintentional contact with adjacent micro LED device. The embodiments of the present invention can be any appropriate sizes, and not limited to such sizes.

Figure 24:
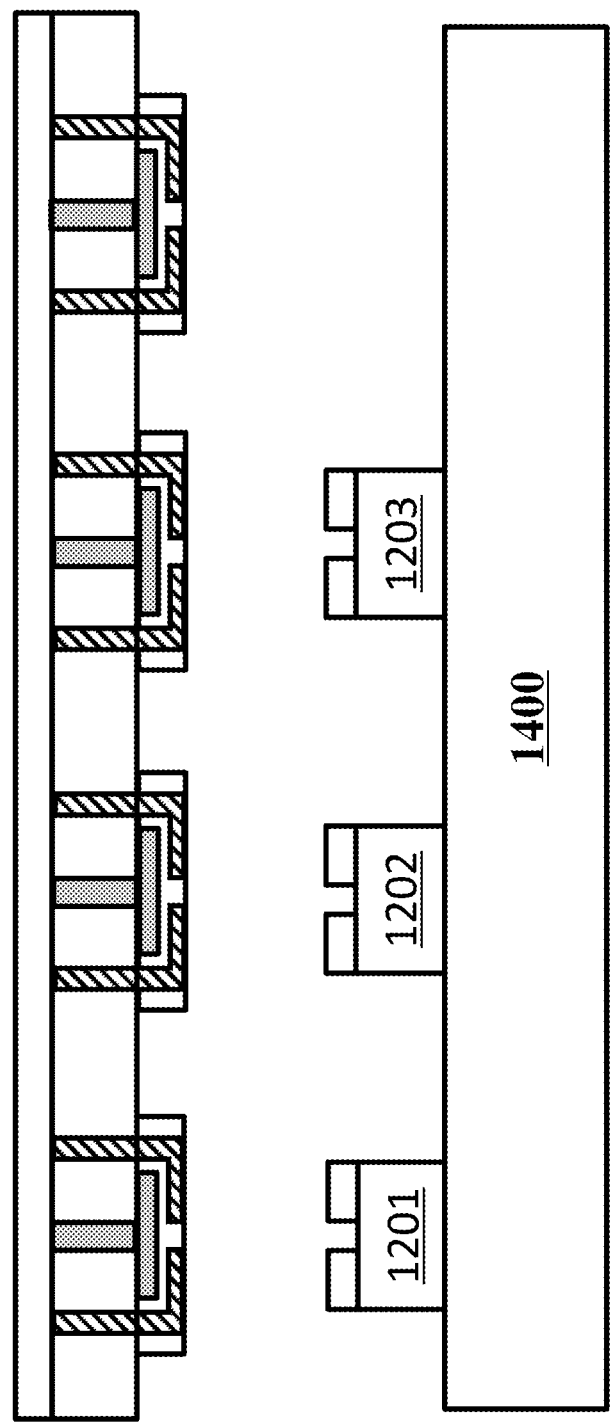
FIG. 24 illustrates a fourth step of the transfer method of the micro element according to the sixth embodiment.

Referring to FIG. 24, release the micro elements 1201-1203 on the acceptor substrate 1400. The acceptor substrate can be automotive glass, glass sheet, flexible electronic substrate, such as flexible film of path, display back plate, solar glass, metal, polymer, polymer compound and glass fiber.

In this embodiment, when the transfer device contacts with the micro element array, the test circuit of the transfer device tests the micro element to obtain defect pattern of the micro element array. Then, selectively pick up qualified micro elements to effectively prevent defect micro elements from transfer-printing to the acceptor substrate of terminal applications such as the display backboard during transformation.

Figure 25:
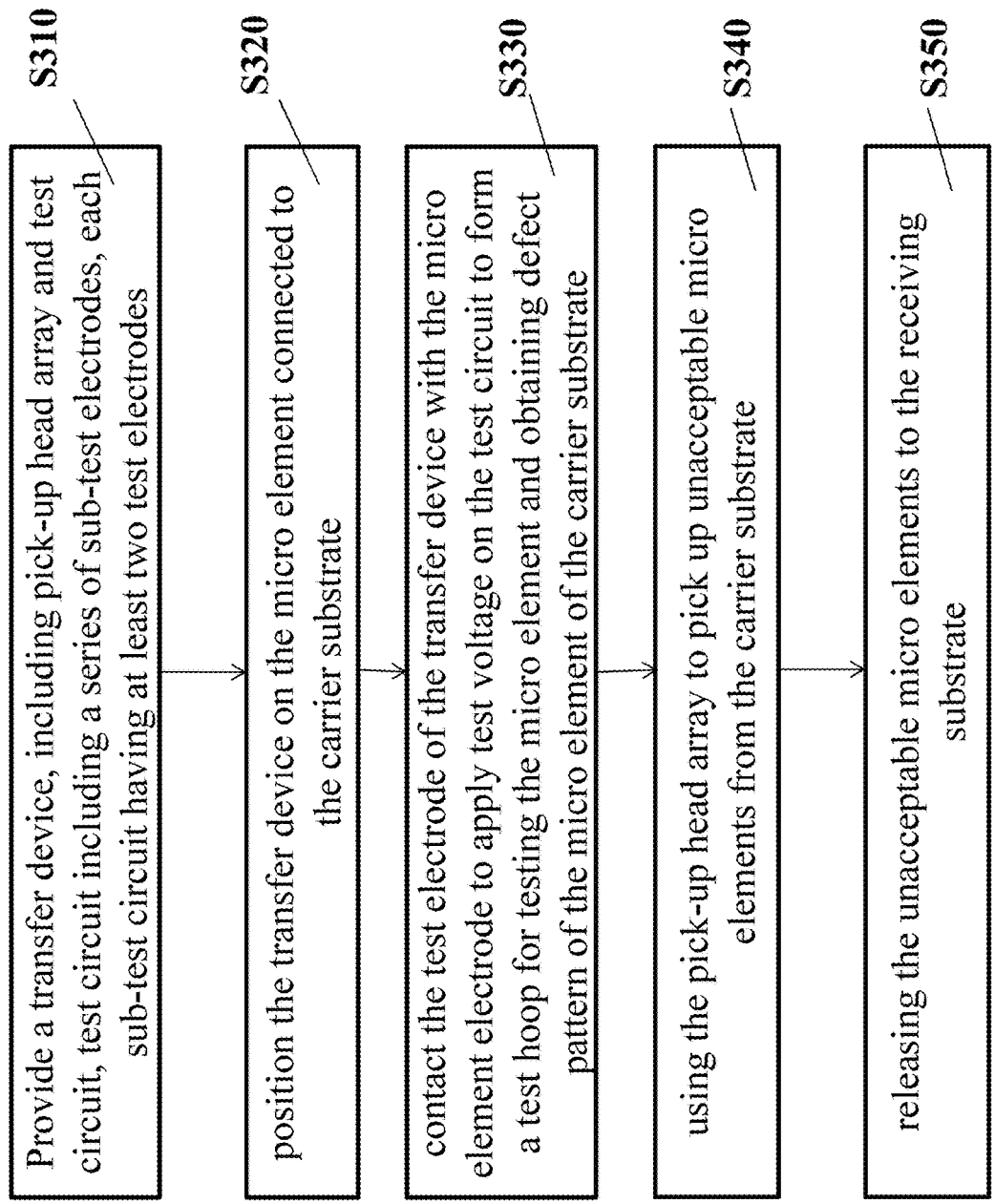
FIG. 25 is flow chart illustrating the transfer method of the micro element according to a seventh embodiment.
Figure 26:
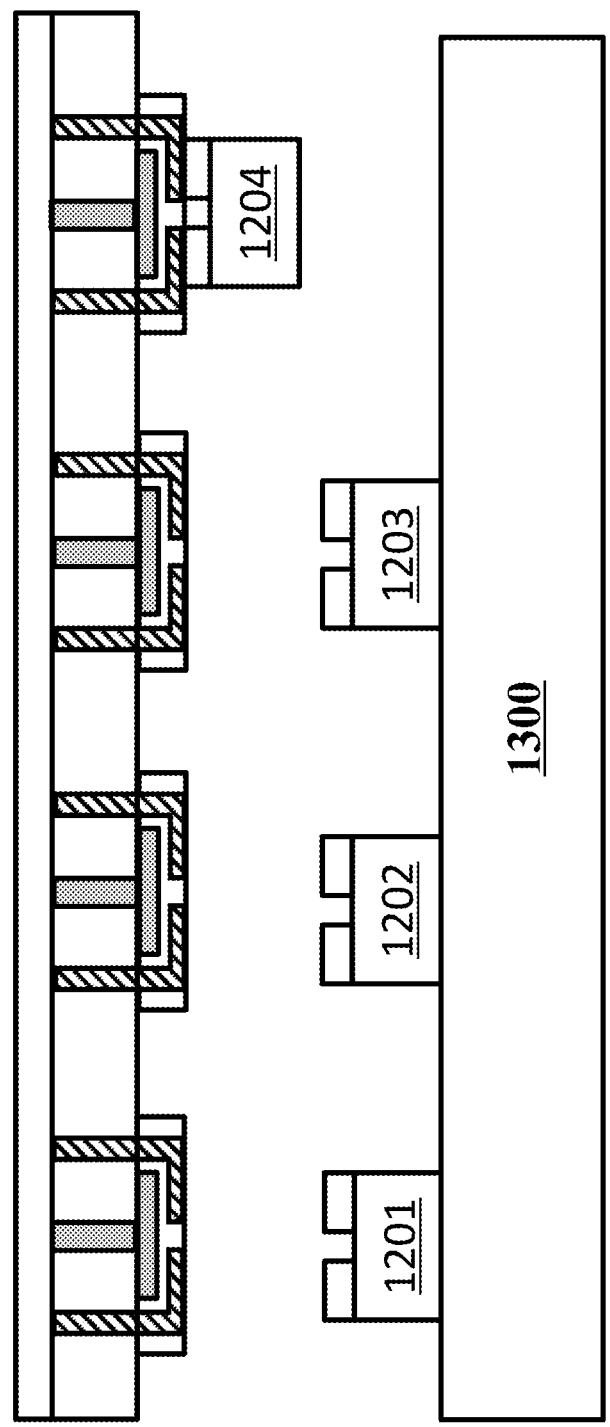
FIG. 26 illustrates a first step of the transfer method of the micro element according to the seventh embodiment.
Figure 27:
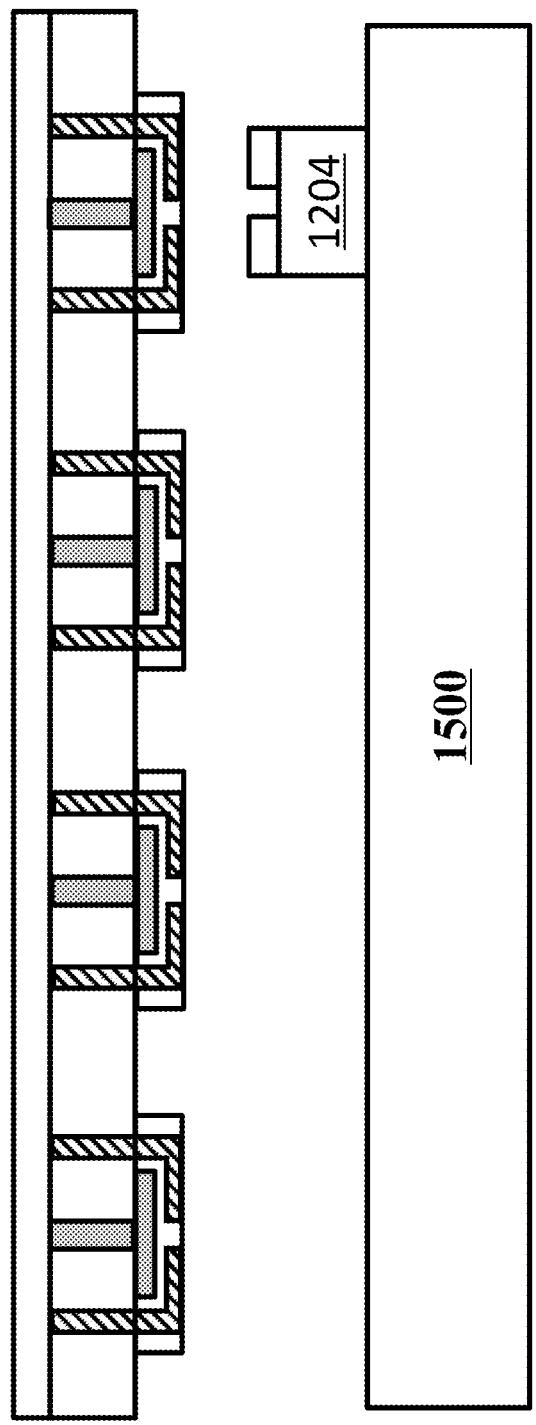
FIG. 27 illustrates a second step of the transfer method of the micro element according to the seventh embodiment.

FIG. 25 is a flow diagram of a transfer method of the micro element according to the seventh preferred embodiment of the present invention, mainly comprises steps S310-S350, wherein, steps S310-S330 are same as steps S210-S230. Brief description is given below targeting at steps S340-S350. Referring to FIG. 26, by controlling the pick-up head array of the transfer device, selectively pick up unqualified micro elements 1204 on the carrier substrate 1300; referring to FIG. 27, release unqualified micro elements 1204 on the acceptor substrate 1500. In this embodiment, the acceptor substrate 1500 can be any recovery device for recovering and placing the unqualified micro element.

In this embodiment, before transfer of the micro element, at first, test the micro element array with the test circuit of the transfer device, and transfer it to the recovery device. Therefore, those remained on the micro element of the carrier substrate are qualified products for prior removal of unqualified micro elements.

Figure 28:
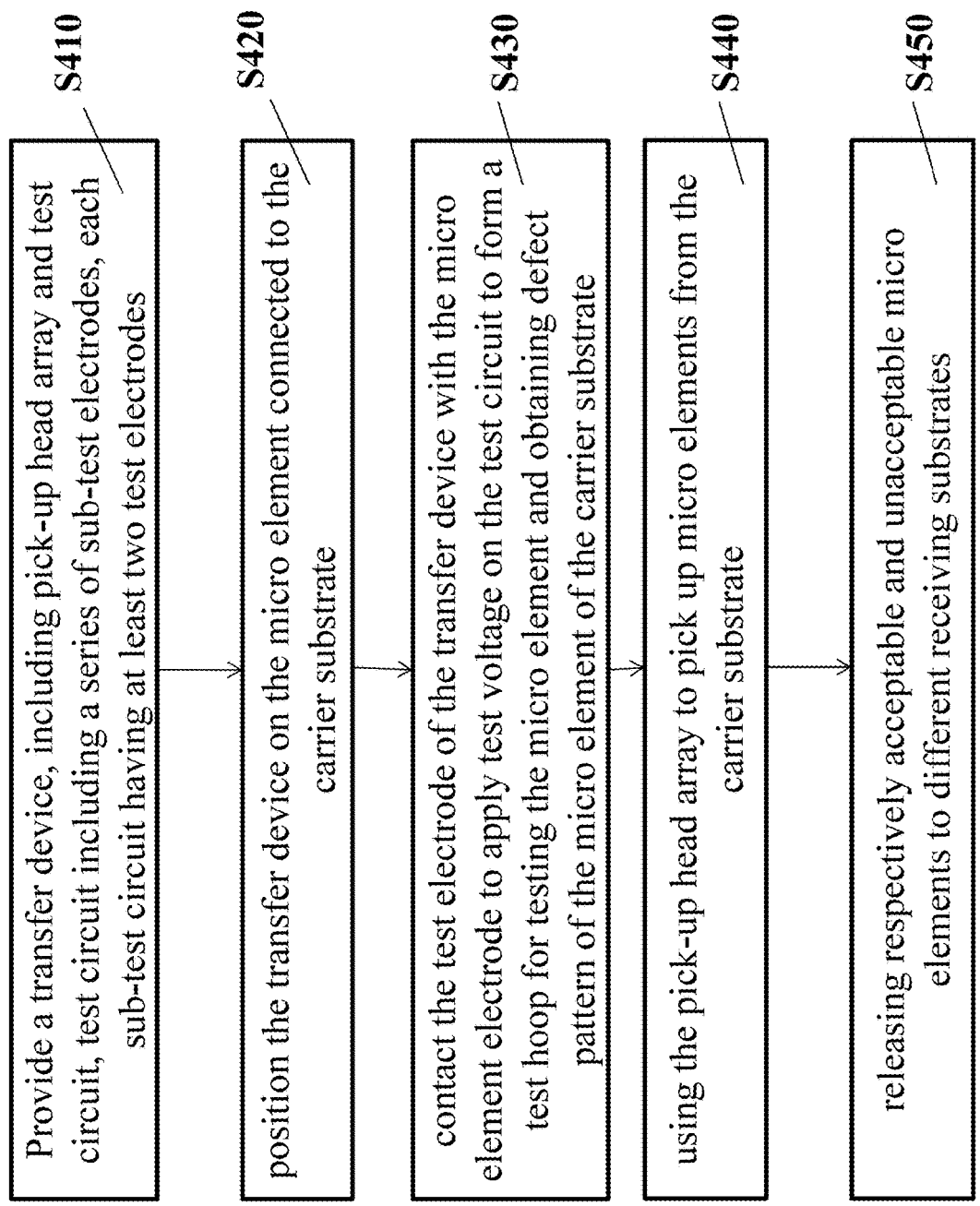
FIG. 28 is flow chart illustrating the transfer method of the micro element according to an eighth embodiment.
Figure 29:
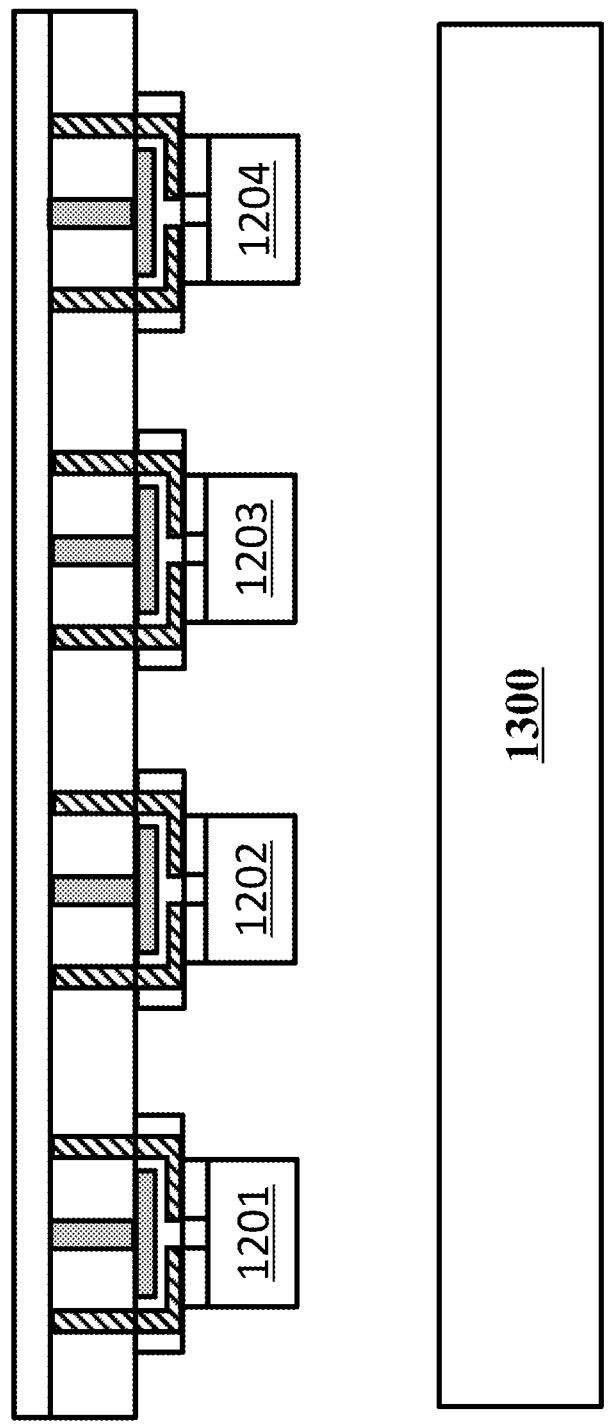
FIG. 29 illustrates a first step of the transfer method of the micro element according to the eighth embodiment.
Figure 30:
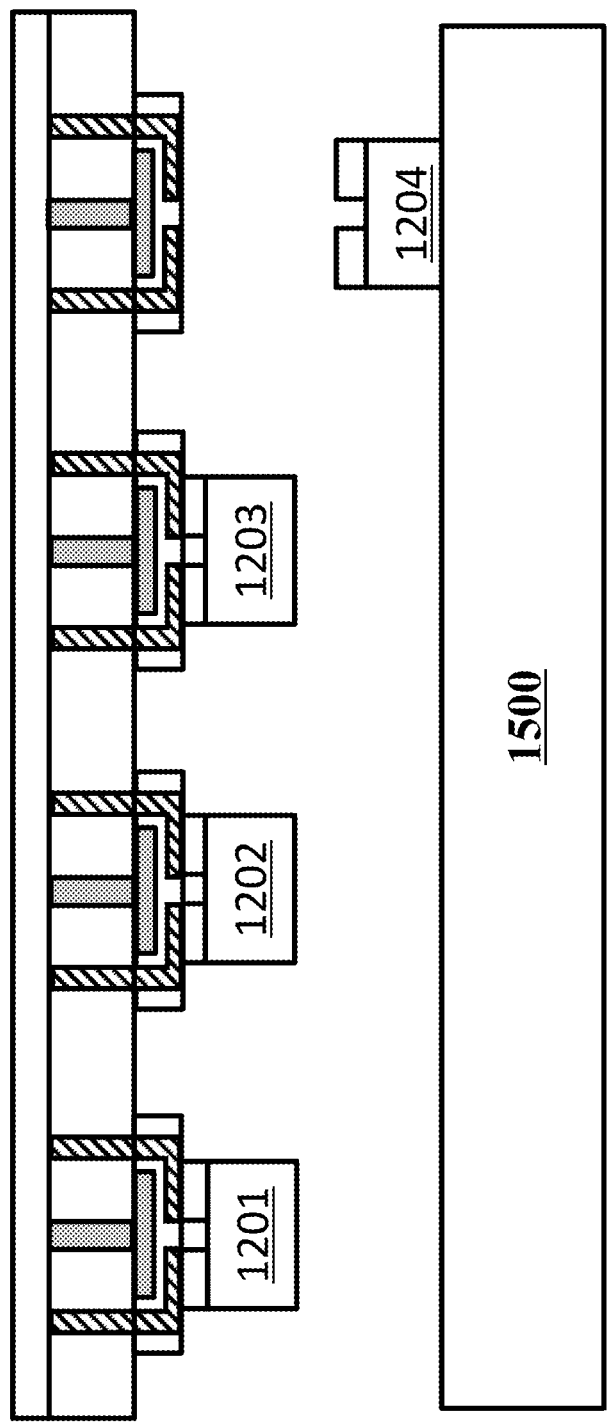
FIG. 30 illustrates a second step of the transfer method of the micro element according to the eighth embodiment.
Figure 31:
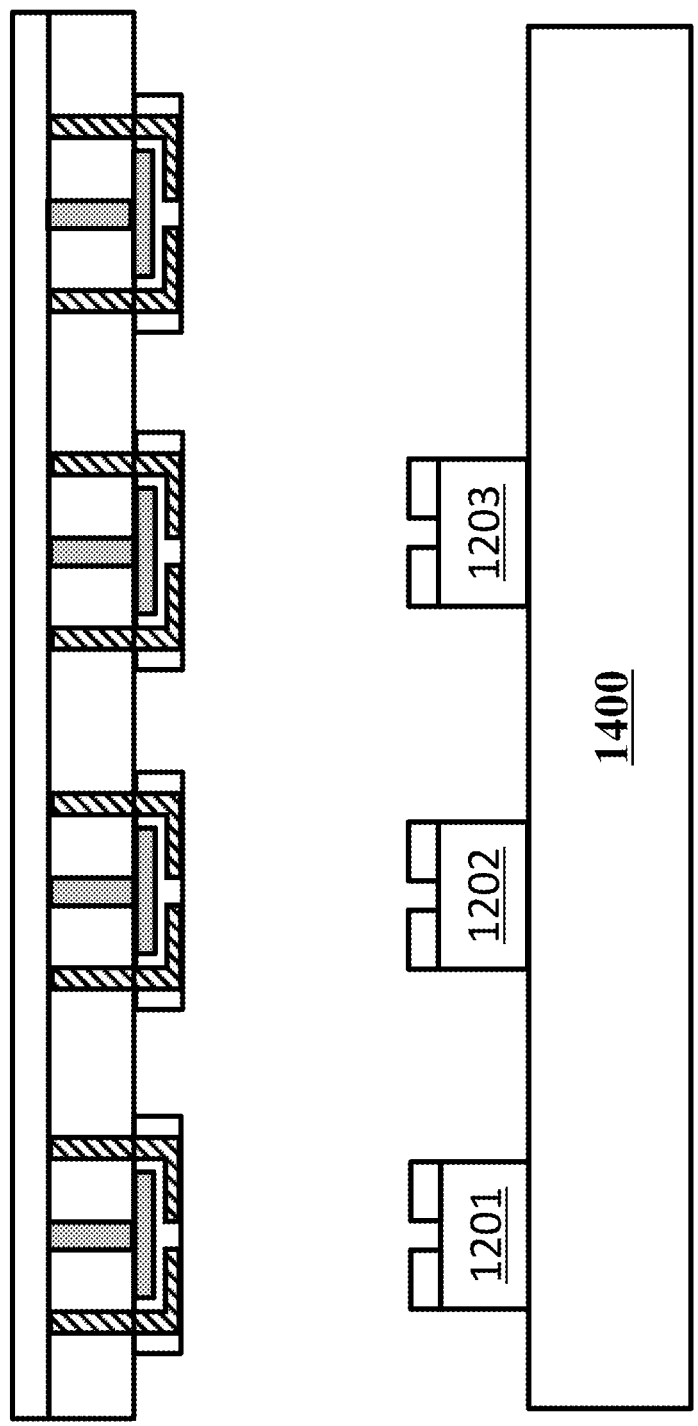
FIG. 31 illustrates a third step of the transfer method of the micro element according to the eighth embodiment.

FIG. 28 is a flow diagram of a transfer method of the micro element according to the eighth preferred embodiment of the present invention, mainly comprises steps S410-S450, wherein, steps S410-S430 are basically same as steps S210-S230. Brief description is given below targeting at steps S440-S450. Referring to FIG. 29, by controlling the pick-up head array of the transfer device, selectively pick up the micro elements 1201-1204 on the carrier substrate 1300; referring to FIG. 30, by controlling, selectively release unqualified micro elements 1204 on the first acceptor substrate 1500; referring to FIG. 31, release qualified micro elements 1201-1203 on the second acceptor substrate 1400. In this embodiment, the first acceptor substrate 1500 can be any recovery device for recovering and placing the unqualified micro element; the second acceptor substrate 1400 can be a flexible electronic substrate, such as a flexible film with a circuit, display back plate, and the like.

In S450 of this embodiment, it is acceptable to release qualified micro elements 1201-1203 on the second acceptor substrate 1400 and then release unqualified micro elements 1204 on the first acceptor substrate 1500.

Figure 32:
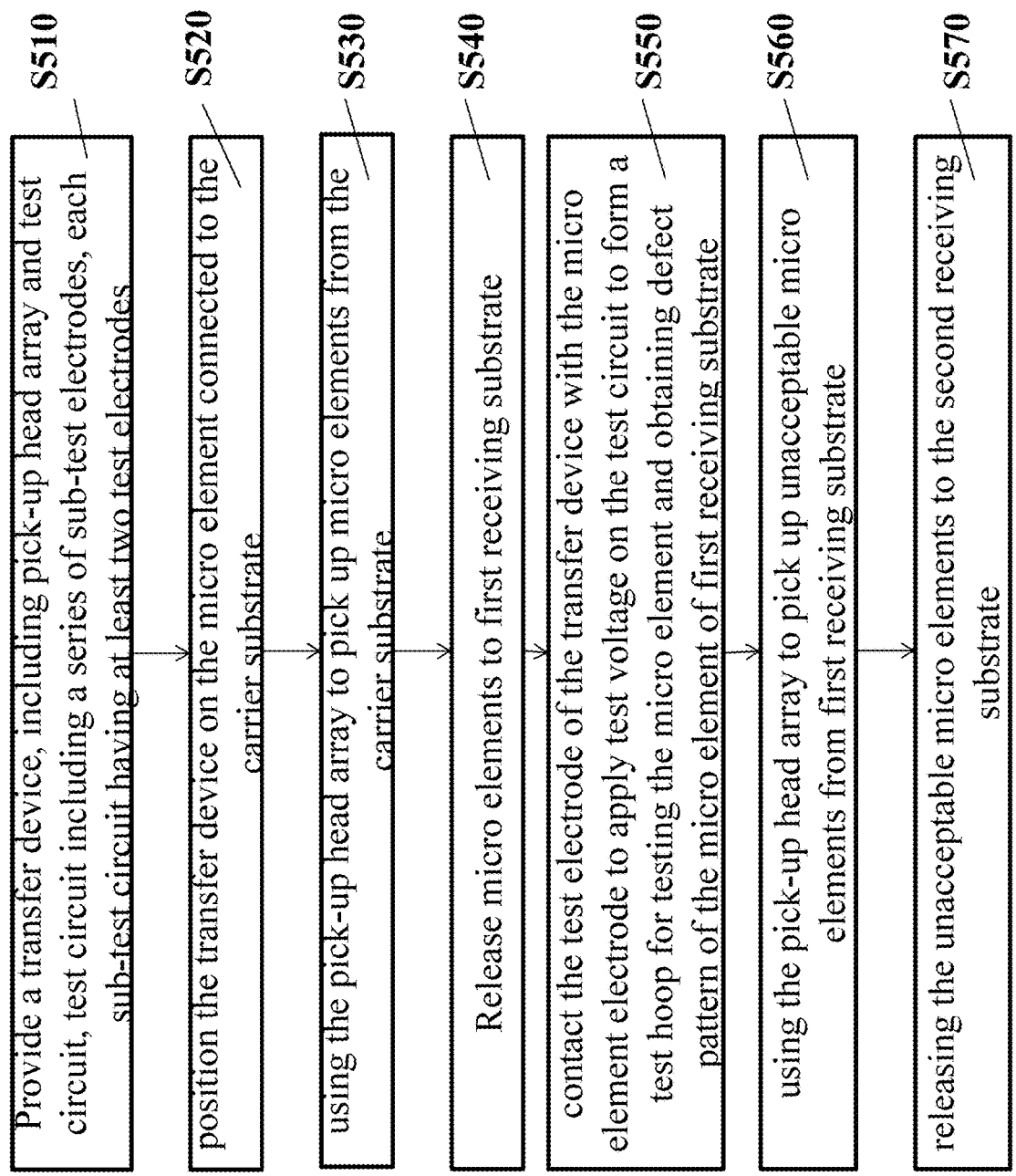
FIG. 32 is a flow chart illustrating the transfer method of the micro element according to a ninth embodiment.

FIG. 32 is a flow diagram of a transfer method of the micro element according to the ninth preferred embodiment of the present invention, mainly comprising steps S510-S570, wherein, steps S510-S520 are basically same as S210-S220. Brief description is given below targeting at steps S530-S570.

Figure 33:
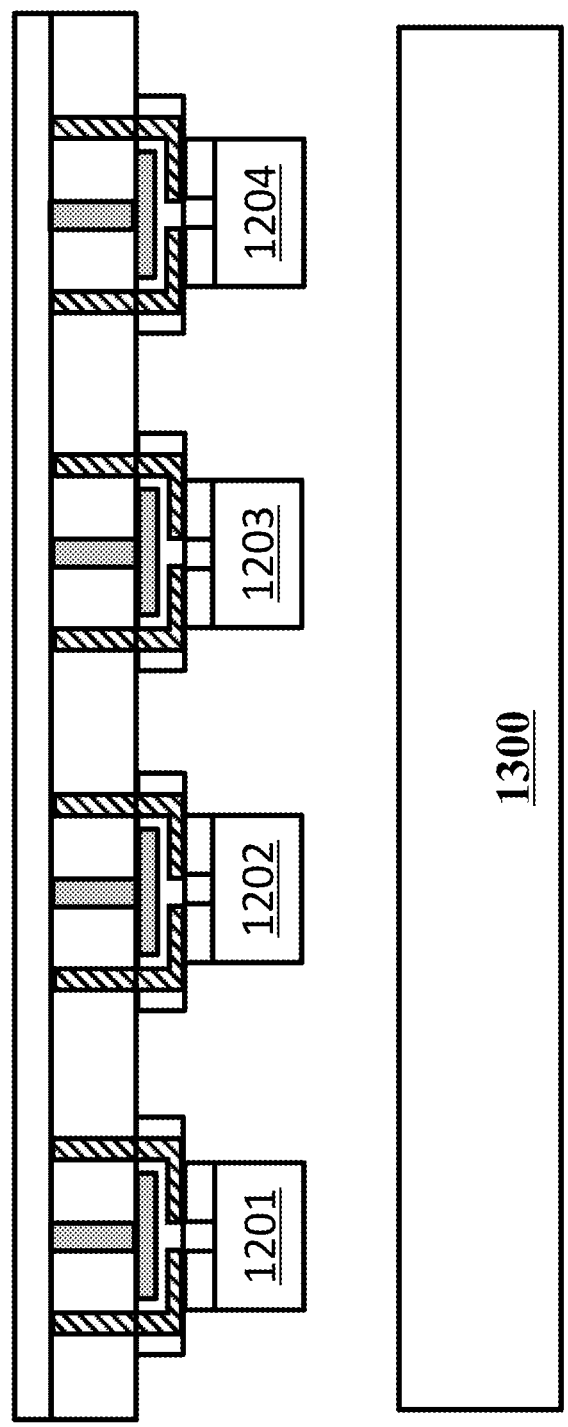
FIG. 33 illustrates a first step of the transfer method of the micro element according to the ninth embodiment.
Figure 34:
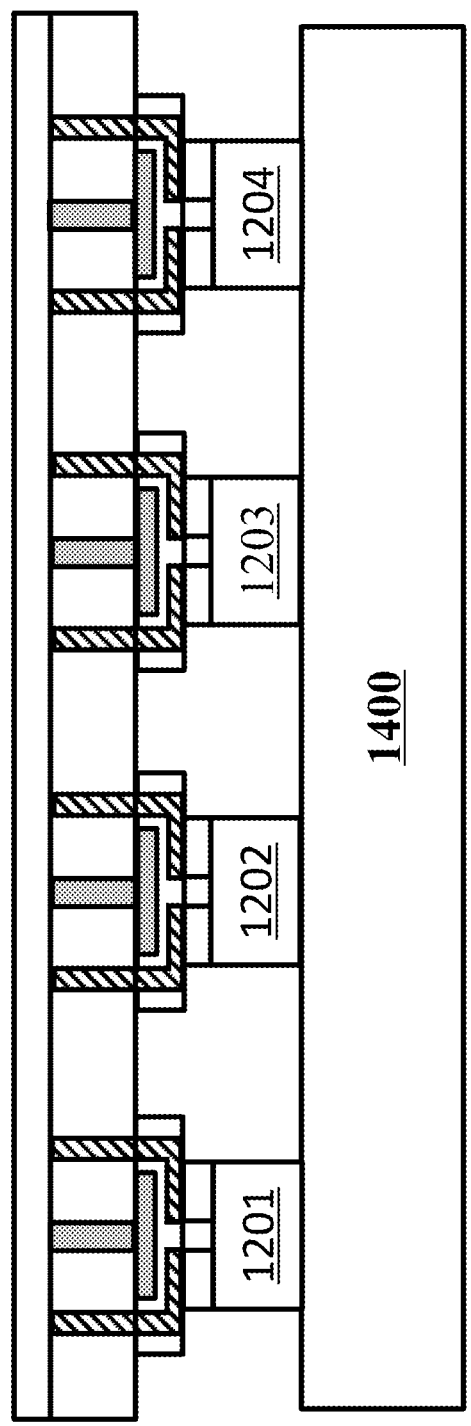
FIG. 34 illustrates a second step of the transfer method of the micro element according to the ninth embodiment.
Figure 35:
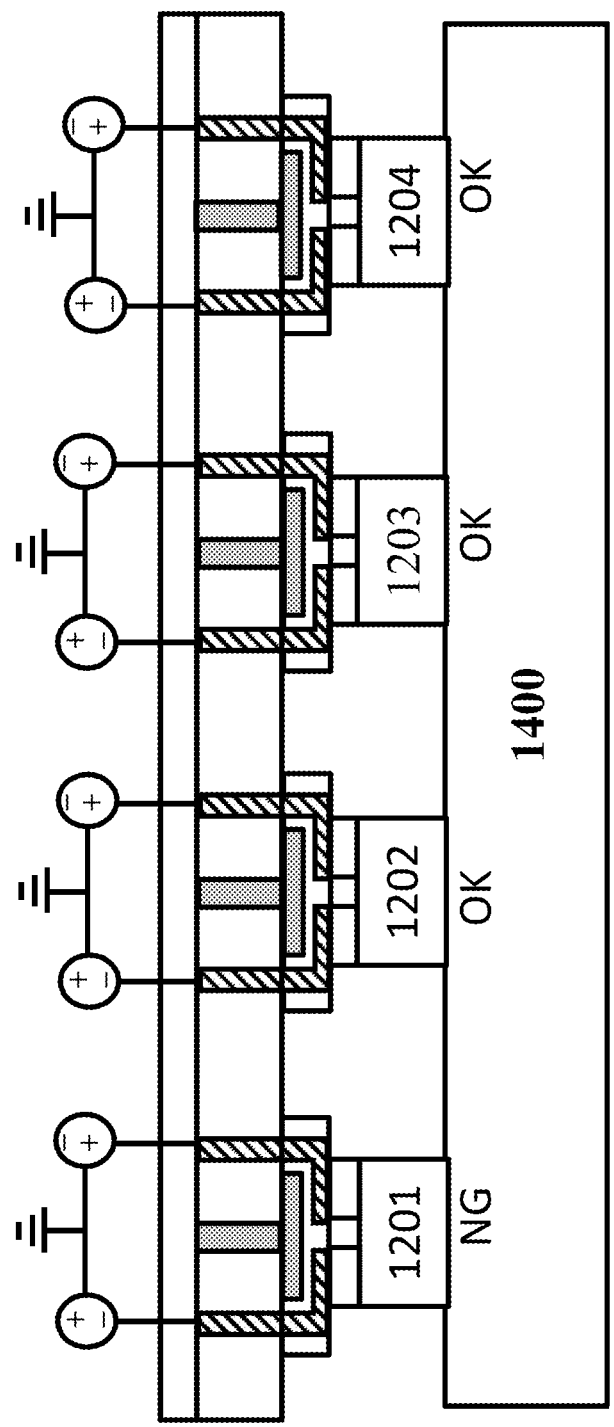
FIG. 35 illustrates a third step of the transfer method of the micro element according to the ninth embodiment.
Figure 36:
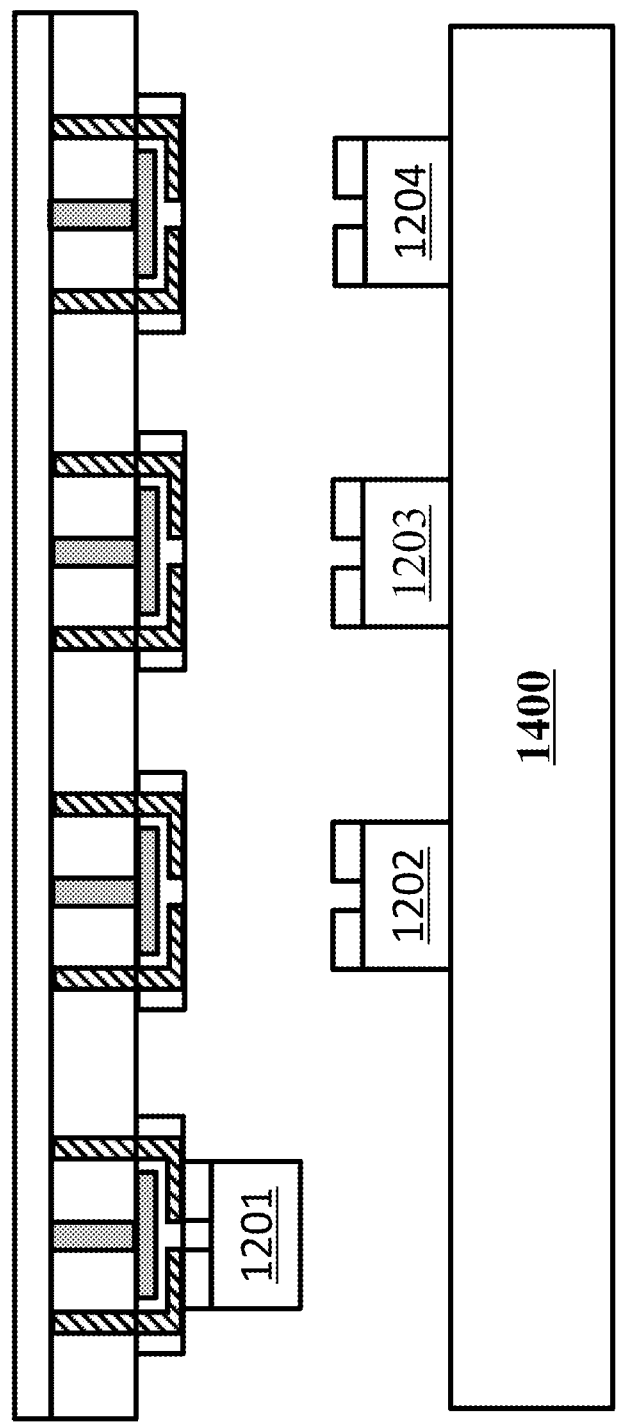
FIG. 36 illustrates a fourth step of the transfer method of the micro element according to the ninth embodiment.

Referring to FIG. 33, use the pick-up head array of the transfer device to selectively pick up the micro elements 1201-1204 on the carrier substrate 1300; referring to FIG. 34, release the micro elements 1201-1204 on the second acceptor substrate 1400. The pick-up head of the transfer device keeps contact with the micro element, and the test electrode of the transfer device contacts with the micro element electrode; referring to FIG. 35, apply voltage on the test electrode, and each micro element 1201-1204 forms a sub-test hoop for testing and obtaining the defect pattern of the micro element. For example, photoelectric parameters of the micro element 1201 are unqualified (namely, the defect micro element), and photoelectric parameters of the micro element 1202-1204 are qualified; referring to FIG. 36, use the pick-up head array of the transfer device to selectively pick up the defect micro element 1201 of the second acceptor substrate 1400; referring to FIG. 37, release the defect micro element 1201 on the first acceptor substrate 1500, wherein, the first acceptor substrate 1500 can be any recovery device for recovering and placing the unqualified micro element; and the second acceptor substrate 1400 is a flexible electronic substrate, such as a flexible film with a circuit, display back plate, and the like.

The pick-up head arrays according to the above embodiments pick up or release micro elements through electrostatic force, Van der Waals force and vacuum adsorption force. The transfer method of the micro element of each embodiment takes the transfer device 1100 disclosed in FIG. 1 as an example. However, this invention is not limited to this transfer device. For micro elements with different electrode structures, the transfer devices of different structures can be selected.

In the transfer method of the micro element, the micro element arrays can be tested and transfer printed for several times through the transfer device.

The transfer method for the micro element according to aforesaid embodiment can also be used for fabricating electronic device, or be widely applied in electronic devices like mobile phone, tablet PC, and the like.

Despite the description of exemplary embodiments of the present invention, it should be understood that it is not intended to limit the scope of the invention to the particular form set forth. On the contrary, alternatives and modifications can be made by the persons skilled in the art without departing from the spirit and scope of the invention as defined by the appended claims.

The invention claimed is:

1. A transfer device for a micro element, the transfer device comprising:
   a base substrate, having two opposing surfaces;
   a pick-up head array, formed over a first surface among the two opposing surfaces of the base substrate for picking up or releasing the micro element; and
   a test circuit set inside the base substrate and/or on one of the two opposing surfaces of the base substrate, which has a series of sub-test circuits, each sub-test circuit at least having two test electrodes for simultaneous test of photoelectric parameters of the micro element when the transfer device transfers the micro element.

2. The transfer device of claim 1, wherein at least one test electrode of each sub-test circuit is formed over a surface of each pick-up head of the pick-up head array for contacting with the micro element, and connects to the micro element electrode when the pick-up head array contacts with the micro element.

3. The transfer device of claim 2, wherein each sub-test circuit has a pair of test electrodes respectively.

4. The transfer device of claim 2, wherein each sub-test circuit shares a test electrode.

5. The transfer device of claim 2, wherein the test circuit also comprises a retractable electrode located on the first surface of the base substrate, which forms a sub-test circuit together with the test electrode formed over the surface of the each pick-up head of the pick-up head array for contacting with the micro element.

6. The transfer device of claim 1, wherein the transfer device also comprises a CMOS integrated circuit over a second surface among the two opposing two surfaces of the base substrate, which connects to the test circuit.

7. The transfer device of claim 6, wherein the base substrate has a through-hole structure, and the test circuit passes through the through-hole structure and extends to the second surface of the base substrate.

8. The transfer device of claim 6, wherein the base substrate is a Si substrate, and the CMOS integrated circuit is formed by a portion of the Si substrate.

9. The transfer device of claim 6, wherein the CMOS integrated circuit is a structure layer formed over the base substrate.

10. The transfer device of claim 1, wherein the pick-up head array picks up the micro element through electrostatic force, Van der Waals force, or vacuum adsorption force.

11. The transfer device of claim 1, wherein the pick-up head array has a static electrode layer and a dielectric layer cladding on the electrode layer, wherein, when the electrode layer applies an attraction voltage, the pick-up head array produces static attraction force to pick up the micro element contact therewith.

12. The transfer device of claim 1, wherein a surface of each pick-up head of the pick-up head array is made of biomimetic gecko material to attract the micro element by virtue of absorption capacity of the biomimetic gecko material.

13. The transfer device of claim 1, wherein the pick-up head array is a series of suction nozzles forming a suction nozzle array, which attracts or releases the micro element through a vacuum pressure.

14. The transfer device of claim 13, wherein the transfer device also comprises a cavity, a plurality of vacuum paths and a switch component, the suction nozzle array is connected to the cavity via a plurality of the vacuum paths, and valves are provided for switching on/off, and the switch component is used for controlling on or off of each valve of each vacuum path such that the suction nozzle array is controlled to attract or release required micro element through the vacuum pressure.

15. The transfer device of claim 14, wherein the switch component comprises a CMOS integrated circuit, and an address electrode array connected to the CMOS integrated circuit, wherein, each vacuum path valve corresponds to the address electrode array.

16. The transfer device of claim 15, wherein each valve is a movable member, wherein, the address electrode array is under selective excitation by the CMOS integrated circuit with voltage potential to generate electrostatic attraction, through which, corresponding movable member deflects or approaches corresponding address electrode, thereby controlling opening or closing of each vacuum path.

17. The transfer device of claim 14, wherein the vacuum path is a series of micro-hole structures passing through the base substrate, wherein, one end the series of micro-hole structures is connected to the cavity, and another end of the series of micro-hole structures is connected to the suction nozzle array.

18. A transfer method of a micro element, the method comprising:
(1) providing a transfer device, which comprises a base substrate, a pick-up head array formed over a surface of the base substrate and a test circuit inside and/or on the surface of the base substrate, wherein, the test circuit has a series of sub-test circuits, each sub-test circuit having at least two test electrodes;
(2) positioning the transfer device on the micro element connected to a carrier substrate; and
(3) contacting the at least two test electrodes of the transfer device with one or more electrodes of the micro element to apply a test voltage on the test circuit to form a test hoop for testing the micro element and obtaining a defect pattern of the micro element on the carrier substrate.

19. The transfer method of claim 18, further comprising:
(4) using the pick-up head array of the transfer device to pick up qualified micro elements on the carrier substrate;
(5) releasing the qualified micro elements onto an acceptor substrate.

20. The transfer method of claim 18, further comprising:
(4) using the pick-up head array of the transfer device to pick up unqualified micro elements on the carrier substrate;
(5) releasing the unqualified micro elements onto an acceptor substrate.

* * * * *